United States Patent
Miyamoto et al.

(10) Patent No.: US 10,651,073 B2
(45) Date of Patent: May 12, 2020

(54) SAMPLE TRANSFER SYSTEM AND SOLAR CELL PRODUCTION METHOD

(71) Applicant: Kaneka Corporation, Osaka (JP)

(72) Inventors: Minoru Miyamoto, Toyooka (JP); Yutaka Yanagihara, Toyooka (JP); Hideyuki Makita, Toyooka (JP)

(73) Assignee: KANEKA CORPORATION, Osaka (JP)

( * ) Notice: Subject to any disclaimer, the term of this patent is extended or adjusted under 35 U.S.C. 154(b) by 20 days.

(21) Appl. No.: 15/472,791

(22) Filed: Mar. 29, 2017

(65) Prior Publication Data

US 2017/0200630 A1   Jul. 13, 2017

Related U.S. Application Data

(63) Continuation of application No. PCT/JP2015/077763, filed on Sep. 30, 2015.

(30) Foreign Application Priority Data

Sep. 30, 2014   (JP) .................................. 2014-202574

(51) Int. Cl.
*H01L 21/683* (2006.01)
*H01L 21/677* (2006.01)
(Continued)

(52) U.S. Cl.
CPC ........ *H01L 21/6838* (2013.01); *C23C 16/458* (2013.01); *H01L 21/677* (2013.01);
(Continued)

(58) Field of Classification Search
CPC .................... H01L 21/6835; H01L 21/6838
See application file for complete search history.

(56) References Cited

U.S. PATENT DOCUMENTS 4,381,601 A * 5/1983 Tamai ............... H01L 21/67144
                                                         118/243
4,479,673 A * 10/1984 Inaba ....................... B25J 15/10
                                                         269/118
(Continued)

FOREIGN PATENT DOCUMENTS

JP    H09-129587 A    5/1997
JP    2005051260 A    2/2005
(Continued)

OTHER PUBLICATIONS

International Search Report issued in International Application No. PCT/JP2015/077763, dated Jan. 12, 2016 (2 pages).
(Continued)

*Primary Examiner* — Gerald McClain
(74) *Attorney, Agent, or Firm* — Osha Liang LLP

(57) ABSTRACT

A sample transfer system includes a sample-mounting member mounting a sample thereonto, and a sample-moving device lifting the sample to move the sample between the sample-mounting member and another location. The sample-mounting member includes a first predetermined sample-mounting region mounting the sample, and a recessed part on or around a side of the first predetermined sample-mounting region. The sample-moving device includes a first sample-holding device, the first sample-holding device including a sample-holding surface facing the sample to be lifted, a first contact member contacting with part of the sample, and a movement mechanism moving the first contact member in a direction along the sample-holding surface. Part of the contact member enters the recessed part when the first sample-holding device is brought ill proximity to the first predetermined sample-mounting region, the part of the contact member moving
(Continued)

within the recessed part by operating the movement mechanism.

19 Claims, 17 Drawing Sheets

(51) Int. Cl.
    *H01L 31/0224*      (2006.01)
    *C23C 16/458*      (2006.01)
    *H01L 31/0236*      (2006.01)
    *H01L 31/0747*      (2012.01)
    *H01L 31/18*      (2006.01)

(52) U.S. Cl.
    CPC ...... *H01L 21/6835* (2013.01); *H01L 31/0224* (2013.01); *H01L 31/02363* (2013.01); *H01L 31/022466* (2013.01); *H01L 31/0747* (2013.01); *H01L 31/1884* (2013.01)

(56) References Cited

U.S. PATENT DOCUMENTS

| | | | | |
|---|---|---|---|---|
| 4,610,473 A * | 9/1986 | Hawkswell | .......... | B25J 15/0004 29/740 |
| 4,770,599 A * | 9/1988 | Hawkswell | ........ | H05K 13/0413 414/752.1 |
| 4,797,996 A * | 1/1989 | Lobry | ................ | H05K 13/0413 279/133 |
| 4,866,824 A * | 9/1989 | Falk | ................... | H05K 13/0413 29/33 R |
| 7,360,322 B2 * | 4/2008 | Iwasaka | ............ | H01L 21/67784 294/188 |
| 2003/0033728 A1 | 2/2003 | Iwasaka et al. | | |
| 2003/0191551 A1 * | 10/2003 | Gotoh | ................ | H01L 21/6838 700/121 |
| 2006/0194514 A1 * | 8/2006 | Popescu | ........... | H01L 21/67092 451/8 |
| 2012/0313388 A1 * | 12/2012 | Nakanishi | .......... | H01L 21/6838 294/183 |
| 2013/0195587 A1 | 8/2013 | Hosaka et al. | | |

FOREIGN PATENT DOCUMENTS

| | | |
|---|---|---|
| JP | 2011176053 A | 9/2011 |
| JP | 2013033809 A | 2/2013 |
| JP | 2013165208 A | 8/2013 |
| JP | 2014118631 A | 6/2014 |

OTHER PUBLICATIONS

International Preliminary Report on Patentability issued in International Application No. PCT/JP2015/077763 dated Apr. 4, 2017 (12 pages).

* cited by examiner

SAMPLE TRANSFER SYSTEM AND SOLAR CELL PRODUCTION METHOD

TECHNICAL FIELD

One or more embodiments of the present invention relates to a sample transfer system which transfers a sample such as a substrate from one device, apparatus, or the like to another device, apparatus, or the like, and especially relates to a sample transfer system including a sample-holding device using the Bernoulli effect. In addition, one or more embodiments of the present invention relates to a method for manufacturing a solar cell.

BACKGROUND ART

In the manufacturing process of an industrial product, there are many processes of lifting a sample such as a workpiece or raw material or transferring the sample between devices. In a case of lifting the sample or transferring the sample between devices, it is necessary to grab the sample, and a sample-holding device is provided as a device for grabbing the sample.

Examples of a known sample-holding device include a device of a type of physically clipping a sample with a manipulator, a magnetic chuck using a magnetic force, a vacuum pad using vacuum, and a Bernoulli chuck using the Bernoulli effect (Patent Document 1). The Bernoulli chuck is suitable for holding and lifting a thin and smooth sample such as a sheet or a substrate. In addition, since the Bernoulli chuck can hold the sample in a noncontact manner in theory, the Bernoulli chuck does not have negative effects such as attaching an oil film or dirt to the surface of a sample, and making the surface irregular. Therefore, the sample held by the Bernoulli chuck is less damaged by being held and is preferably used in a case where there is a process where a damage to the sample surface affects the appearance and the quality of a product, such as a CVD process, a sputtering process, a printing process, or a plating process.

In addition, the present applicant newly discloses a method for manufacturing a solar cell (Patent Document 2). The method for manufacturing a solar cell disclosed in Patent Document 2 is, for example, a technique for providing an amorphous semiconductor layer on a crystalline semiconductor substrate by using a PECVD device or the like, and is a method of using a vertical-type vacuum processing device. In the method for manufacturing a solar cell disclosed in Patent Document 2, a plurality of crystalline semiconductor substrates is arranged on a substrate holder (sample-mounting member). Here, many sample-supporting members are provided on the substrate holder.

Initially, the substrate holder is mounted in a horizontal orientation. In this state, the plurality of crystalline semiconductor substrates are arranged side by side on the substrate holder. In this state, gravity acts in a direction from the front surface of the crystalline semiconductor substrate to the rear surface of the substrate. Therefore, the rear surface of the crystalline semiconductor substrate is held on the surface of the substrate holder, and the orientation of the substrate is stabilized.

Then, as the next process, the orientation of the substrate holder is changed from horizontal to vertical. At that time, the gravity direction changes such that gravity acts in the direction from one side of the substrate to another side, and the sample-supporting member is brought into contact with the lower side. The sample-supporting member supporting or gripping the lower side of the crystalline semiconductor substrate prevents the substrate from falling. In addition, as a configuration specific to Patent Document 2, the orientation of the crystalline semiconductor substrate is inclined as illustrated in FIG. 19 and FIG. 20 when the orientation of the substrate holder becomes vertical.

PRIOR ART DOCUMENTS

Patent Documents

Patent Document 1: JP H9-129587 A
Patent Document 2: JP 2014-118631 A

The Bernoulli chuck is disadvantageous in that the suction force of the Bernoulli chuck is less than that of the vacuum pad or the like, and the holding force in a planar direction is particularly weak. Therefore, the held sample is likely to move in the planar direction. That is, the Bernoulli chuck includes a sample-holding surface facing a sample to be held, generates negative pressure by flowing gas between the sample-holding surface and the sample, and sucks the sample toward a sample-holding surface due to difference in pressure from atmospheric pressure. In the Bernoulli chuck, air flow is necessary between the sample-holding surface and the sample, a space through which air passes needs to exist between the sample-holding surface and the sample, and the entire surface of the sample cannot be pressed against the sample-holding surface. In addition, it is difficult to create an engagement part preventing movement of the sample in the planar direction, in the space between the sample-holding surface and the sample.

Therefore, when a sample such as a crystalline semiconductor substrate or the like is held by the Bernoulli chuck, the sample may move in the planar direction during being held. Thus, positioning accuracy when the sample is attached to or detached from the sample-mounting member such as a substrate holder is deteriorated and handling accuracy cannot be improved, which leads to lowering of productivity of solar cells. In addition, if the method for manufacturing a solar cell disclosed in Patent Document 2 is adopted, the orientation of the crystalline semiconductor substrate is inclined when the orientation of the substrate holder is changed from horizontal to vertical. That is, the crystalline semiconductor substrate is moved from the original position and the orientation is changed. Furthermore, the lower side of the crystalline semiconductor substrate is gripped. Therefore, when the Bernoulli chuck is brought close to the sample in order to collect the sample, the orientation (rotation orientation in the planar direction) of the Bernoulli chuck may not match the orientation of the sample, and suction failure may occur. Furthermore, in a case where the sample is sucked in a state where the sample is gripped, the sample may be caught and broken. For example, in a heterojunction solar cell, which is a solar cell including a crystalline silicon substrate with a heterojunction and is produced in a low-temperature process not exceeding 200 degrees Celsius, since a damage mitigation effect in a heating process cannot be expected much, the crystalline silicon substrate is greatly damaged when the crystalline silicon substrate is held by the Bernoulli chuck.

One or more embodiments of the present invention provide a sample transfer system which can prevent a sample from moving in a planar direction during transfer, can correct the orientation of the sample, experiences few suction failures, and eliminates occurrence of breakage during suction.

SUMMARY

One or more embodiments of the present invention relate to a sample transfer system including: a sample-mounting member mounting a sample thereonto; and a sample-moving device lifting the sample to move the sample between the sample-mounting member and another location, the sample-mounting member including a predetermined sample-mounting region that mounts the sample and that has a recessed part on or near a side of the predetermined sample-mounting region, the sample-moving device including a sample-holding device, the sample-holding device including: a sample-holding surface facing the sample to be lifted; a contact member contacting with part of the sample; and a movement mechanism moving the contact member in a direction along the sample-holding surface, wherein the sample-holding device generates negative pressure by making a gas flow between the sample-holding surface and the sample to suck the sample toward the sample-holding surface by the negative pressure, thus holding the sample at a position in proximity to the sample-holding surface, and wherein when the sample-holding device is brought in proximity to the predetermined sample-mounting region, part of the contact member enters the recessed part, the part of the contact member moving within the recessed part by operating the movement mechanism.

The recessed part may be a portion partially depressed such as a slot, for example. However, the recessed part may annularly surround the predetermined sample-mounting region. The "recessed part" includes a state where the predetermined sample-mounting region projects and the periphery of the predetermined sample-mounting region is relatively recessed as a result.

The sample-holding device adopted in one or more embodiments of the present invention is a kind of a Bernoulli chuck, and can hold the sample in a noncontact manner. In addition, the sample-holding device adopted in one or more embodiments of the present invention includes the contact member brought into contact with a portion of the sample. Therefore, the sample-holding device can prevent the sample from moving in a planar direction during transfer. In addition, the sample-holding device adopted in one or more embodiments of the present invention includes a movement mechanism which moves the contact member in the direction along the sample-holding surface. Therefore, before the sample mounted on the sample-mounting member is sucked, the orientation of the sample can be corrected by bringing the contact member into contact with the sample and further moving the contact member. In addition, in the sample-mounting member adopted in one or more embodiments of the present invention, the recessed part is provided on the side of the predetermined sample-mounting region or near the side. Part of the contact member of the sample-holding device enters the recessed part when the sample-holding device is brought in proximity to the predetermined sample-mounting region of the sample-mounting member. Therefore, the sample-holding surface of the sample-holding device can be brought closer to the sample. Therefore, the distance between the sample and the sample-holding device becomes appropriate, and negative pressure can be generated by flowing air between them. That is, the Bernoulli chuck brings the sample-holding surface in proximity to the surface of the sample, generates an air flow in the space between them and generates negative pressure, and floats up the sample by using the negative pressure. Therefore, in the Bernoulli chuck, it is necessary to bring the sample-holding surface close to the sample with an interval of about several millimeters between them, and to make the sample-holding surface face the sample. However, since the contact member of the sample-holding device adopted in one or more embodiments of the present invention needs to be brought into contact with the sample, the contact member includes a portion suspended in the direction vertical to the sample-holding surface. Therefore, when the sample-holding surface is brought close to the sample, the front end of the contact member hits the sample-mounting member, and the sample-holding surface cannot be brought close to the sample. In view of the foregoing, in one or more embodiments of the present invention, the recessed part is provided on the side of the predetermined sample-mounting region or near the side, and part of the contact member enters the recessed part when the sample-holding device is brought in proximity to the predetermined sample-mounting region of the sample-mounting member. In addition, by causing the movement mechanism to operate, the part of the contact member can move within the recessed part. Therefore, according to one or more embodiments of the present invention, it is possible to bring the sample-holding surface close to the sample and to make the sample-holding surface face the sample. In addition, it is possible to move the contact member in that state and to change the orientation of the sample.

In the above-described correspondence, at least two of the contact members may be provided, the sample-holding surface may be a polygon, and the at least two of the contact members may be provided at peripheries of at least two different sides of the sample-holding surface.

Furthermore, it is recommended that the contact members are provided at four sides.

The sample-moving device may include a plurality of the sample-holding devices located adjacently, each of the sample-holding devices having the contact member, and the contact members provided on the adjacent sample-holding devices and facing each other may be in a staggered positional relation.

In one or more embodiments of the sample transfer system of the present aspect, the contact members belonging to the adjacent sample-holding devices, the contact members being located at positions facing each other in the adjacent sample-holding devices, are in the staggered positional relation. Here, the "staggered positional relation" means that the contact members belonging to adjacent sample-holding devices are not arranged on a straight line. Therefore, it is possible to make the distance between the sample-holding devices short, and to reduce the size of the device.

The sample-mounting member may include a plurality of the predetermined sample-mounting regions located adjacently, each of the predetermined sample-mounting regions having a recessed part corresponding thereto, and the recessed part provided on the adjacent predetermined sample-mounting regions and facing each other may be in a staggered positional relation.

According to one or more embodiments of the sample transfer system of the present aspect, the sample-mounting member can mount more samples.

The contact member may be a pin and the recessed part may be a slot.

The sample-mounting member may be plate-like, the sample may be mounted on the sample-mounting member when the sample-mounting member is in a horizontal orientation, afterwards the sample-mounting member being changed to a vertical orientation and then returned to the horizontal orientation, and a sample-supporting member may be provided at a side of or near the predetermined sample-mounting region, part of the sample contacting with the sample-supporting member to prevent the sample from falling when the sample-mounting member becomes in the vertical orientation.

The sample-supporting member may be able to prevent movement of the sample in the planar direction of the predetermined sample-mounting region and movement of the sample in a direction separating from the predetermined sample-mounting region.

One or more embodiments of the present invention are obtained by applying the configuration disclosed in the above-described Patent Document 2 to one or more embodiments of the present invention.

The sample may be a semiconductor substrate or a solar cell in-process including a semiconductor layer partly.

Here, "a semiconductor substrate or a solar cell in-process including a semiconductor layer partly" refers to a concept including a semiconductor substrate alone such as a silicon wafer or the like, a semiconductor substrate alone such as a silicon wafer, which is a solar cell in-process, a substrate obtained by laminating any layer on a semiconductor substrate, a substrate obtained by laminating any layer on a semiconductor substrate, which is a solar cell in-process, and a substrate in which a semiconductor layer is provided on glass or the like, which is a solar cell in-process. In particular, a silicon wafer (crystalline silicon substrate) is likely to be broken. In recent years, crystalline silicon substrates become thinner and thinner, and crystalline silicon substrates as thin as about 50 to 150 μm have begun to be used. In a case where a crystalline silicon substrate having such a thickness is used, since the crystalline silicon substrate is more likely to warp and to be broken, the Bernoulli chuck according to one or more embodiments of the present invention may be used.

The sample may be a crystalline silicon substrate or a solar cell in-process mainly including a crystalline silicon substrate.

Examples of a solar cell in which crystalline silicon is used include a crystalline solar cell (diffusion type) and a heterojunction solar cell. It is possible to adopt one or more embodiments of the present invention for the heterojunction solar cell since the heterojunction solar cell is more sensitive to impact or the like due to a silicon-based thin film layer formed in the heterojunction solar cell. That is, in a heterojunction solar cell, which is a solar cell including a crystalline silicon substrate with a heterojunction and is produced in a low-temperature process not exceeding 200 degrees Celsius, a damage mitigation effect in a heating process cannot be expected much. As described above, since damage caused when the semiconductor substrate is held by the Bernoulli chuck is likely to remain in the heterojunction solar cell, it is possible to adopt one or more embodiments of the present invention.

The sample-mounting member may include a positioning member that prevents the sample from changing its position or orientation.

In a method for manufacturing solar cell including a semiconductor substrate or including in part a semiconductor layer, a solar cell substrate in-process may be used as a sample, the solar cell substrate in-process being a solar cell in-process, and a substrate holding process of holding the sample by the above-described sample-holding device of the sample transfer system may be performed.

According to one or more embodiments of the present invention, the performance of a solar cell panel improves, and the yield of solar cell panels improves.

The solar cell substrate in-process may be a crystalline silicon substrate or a solar cell substrate in-process mainly including a crystalline silicon substrate.

The above-described method for manufacturing a solar cell may include a substrate lifting process that holds and lifts the sample mounted on the sample-mounting member using the sample-holding device, and in the substrate lifting process, orientation of the substrate may be corrected by bringing the sample-holding device of the sample-moving device close to the substrate and operating the movement mechanism.

According to one or more embodiments of the present invention, since the orientation of the sample can be corrected and then the sample can be sucked, few suction failures occur and breakage during suction does not occur. In addition, according to one or more embodiments of the present invention, the sample can be transferred in a correct orientation to a device or an apparatus used in the next process.

The above-described method for manufacturing a solar cell may include a process of forming a transparent conductive film on the substrate after the substrate holding process.

From the experience of the present inventors, failure is likely to occur in the process of forming a transparent conductive film. Judging from the experience, it is possible to use the sample-holding device according to one or more embodiments of the present invention in a case where there is the substrate-holding process before the process of forming the transparent conductive film. Furthermore, when plating is performed after the process of forming the transparent conductive film, plating is deposited on a non-desired portion if there is a scratch. However, in a case where plating is performed after the processes according to one or more embodiments of the present invention, deposition of plating on a non-desired portion can be suppressed.

The sample transfer system according to one or more embodiments of the present invention has an effect capable of preventing the sample from moving in the planar direction during transfer. In addition, the sample transfer system according to one or more embodiments of the present invention can correct the orientation of the sample, experiences few suction failures, and can eliminate occurrence of breakage during suction. In addition, according to one or more embodiments of the method for manufacturing a solar cell of the present invention, the yield of solar cells improves.

BRIEF DESCRIPTION OF DRAWINGS

FIGS. 12A and 12B are cross-sectional views illustrating a state where the substrate on the substrate holder is held and lifted by the sample-holding device, which illustrates a step subsequent to the state illustrated in FIG. 11, wherein FIG. 12A is the entire view, and FIG. 12B is a partially enlarged view of the entire view.

FIGS. 13A and 13B are cross-sectional views illustrating a state where the substrate on the substrate holder is held and lifted by the sample-holding device, which illustrates a step subsequent to the state illustrated in FIGS. 12A and 12B, wherein FIG. 13A is the entire view, and FIG. 13B is a partially enlarged view of the entire view.

FIGS. 15A and 15B are plan views illustrating relations between contact pins and the substrate in states when the orientation of the substrate is corrected, wherein FIG. 15A illustrates a state before orientation correction and movement directions of the contact pins are indicated by arrows, and FIG. 15B illustrates a state after the orientation correction.

FIGS. 17A to 17C are explanatory views of manufacturing processes when the solar cell illustrated in FIG. 16 is manufactured, wherein FIG. 17A is a cross-sectional view after each silicon layer is formed, FIG. 17B is a cross-sectional view after each transparent electrode layer is formed, and FIG. 17C is a cross-sectional view after a base electrode layer is formed

DETAILED DESCRIPTION OF EMBODIMENTS

Figure 1:
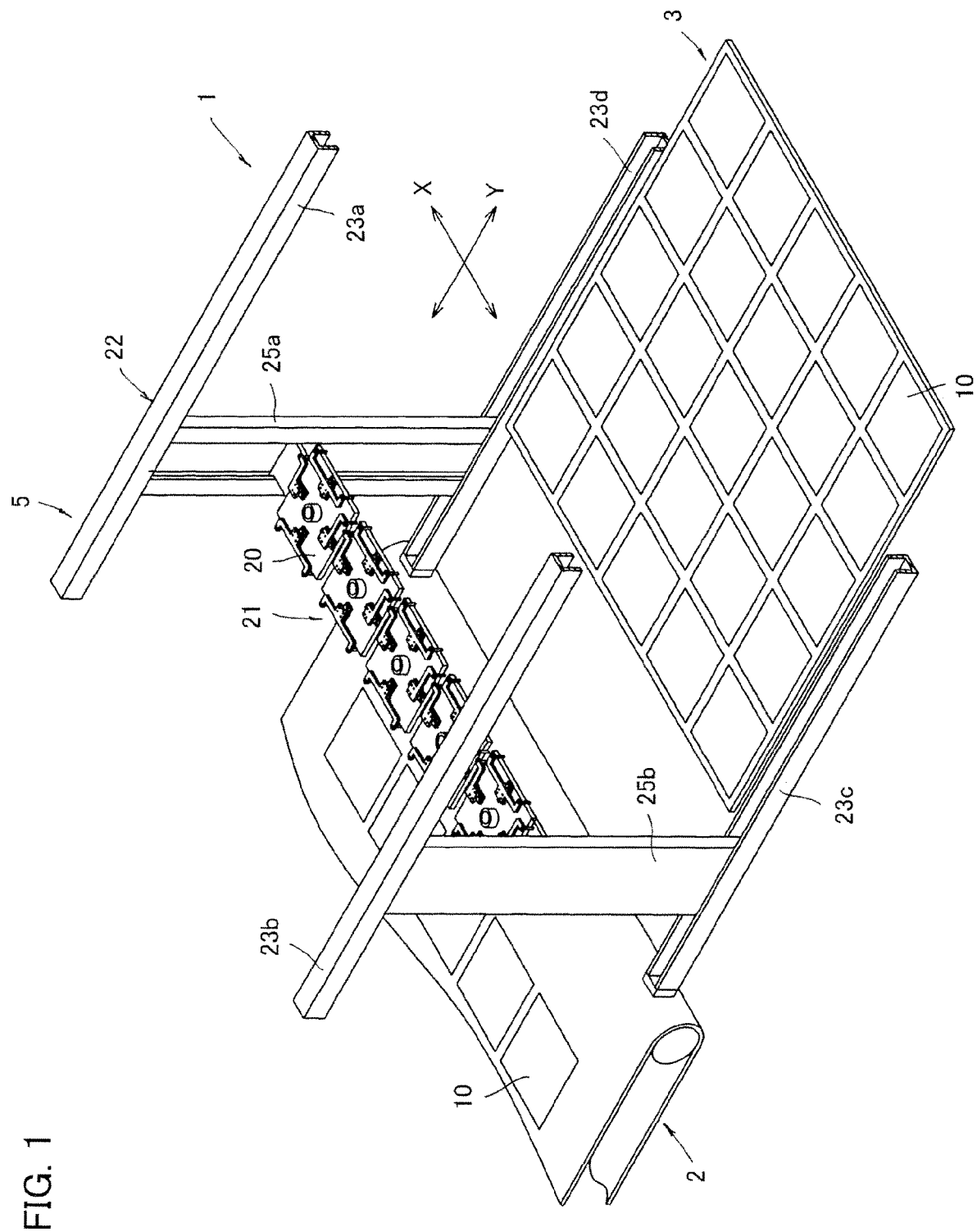
FIG. 1 is a perspective view of the entirety of a sample transfer system according to one or more embodiments of the present invention.

Hereinafter, one or more embodiments of the present invention will be described. Note that the present invention is not limited to the following embodiments. As illustrated in FIG. 1, a sample transfer system 1 according to one or more embodiments of the present invention is configured by a carry-in conveyor 2, a substrate holder (sample-mounting member) 3, and a sample-moving device 5. The sample transfer system 1 according to one or more embodiments of the present invention is a system in which a solar cell substrate 10 in-process (a sample and hereinafter simply referred to as a substrate) that has been conveyed by the carry-in conveyor 2 is moved and transferred to the substrate holder 3 by the sample-moving device 5, and then the substrate 10 is detached from the substrate holder 3 and is transferred to another device. Hereinafter, the system will be described in order.

Known examples of the carry-in conveyor 2 include a walking beam conveyor. The carry-in conveyor 2 can mount and intermittently feed the substrate 10.

As illustrated in FIG. 1, the sample-moving device 5 is configured of a holding device group 21 and a travelling, lifting, and lowering device 22. The holding device group 21 is configured by connecting five sample-holding devices 20 in series, which will be described later. The travelling, lifting, and lowering device 22 is a device which holds the holding device group 21, lifts and lowers the holding device group 21 and causes the holding device group 21 to travel.

The travelling, lifting, and lowering device 22 includes four travelling rails 23a, b, c, d, which are three-dimensionally disposed, and lifting and lowering guides 25a, b are fitted to the travelling rails 23a, b, c, d. The holding device group 21 is fitted to the lifting and lowering guides 25a, b. The travelling, lifting, and lowering device 22 can linearly move the lifting and lowering guides 25a, b along the travelling rails 23a, b, c, d by means of a travelling motor, not illustrated. In addition, the travelling, lifting, and lowering device 22 can lift and lower the holding device group 21 by means of a lifting and lowering motor, not illustrated.

Figure 2:
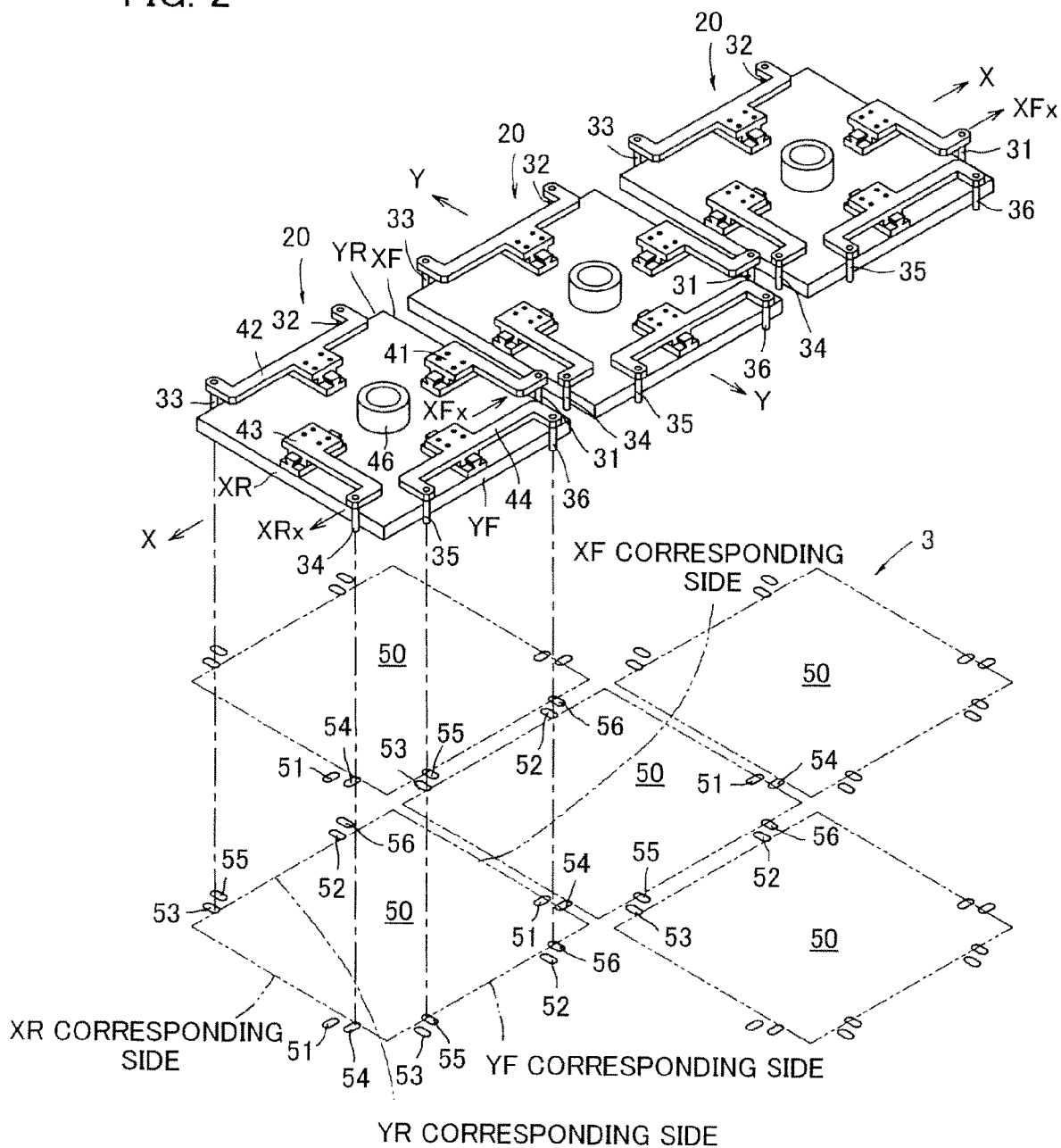
FIG. 2 is a perspective view of main parts of the sample transfer system illustrated in FIG. 1.
Figure 3:
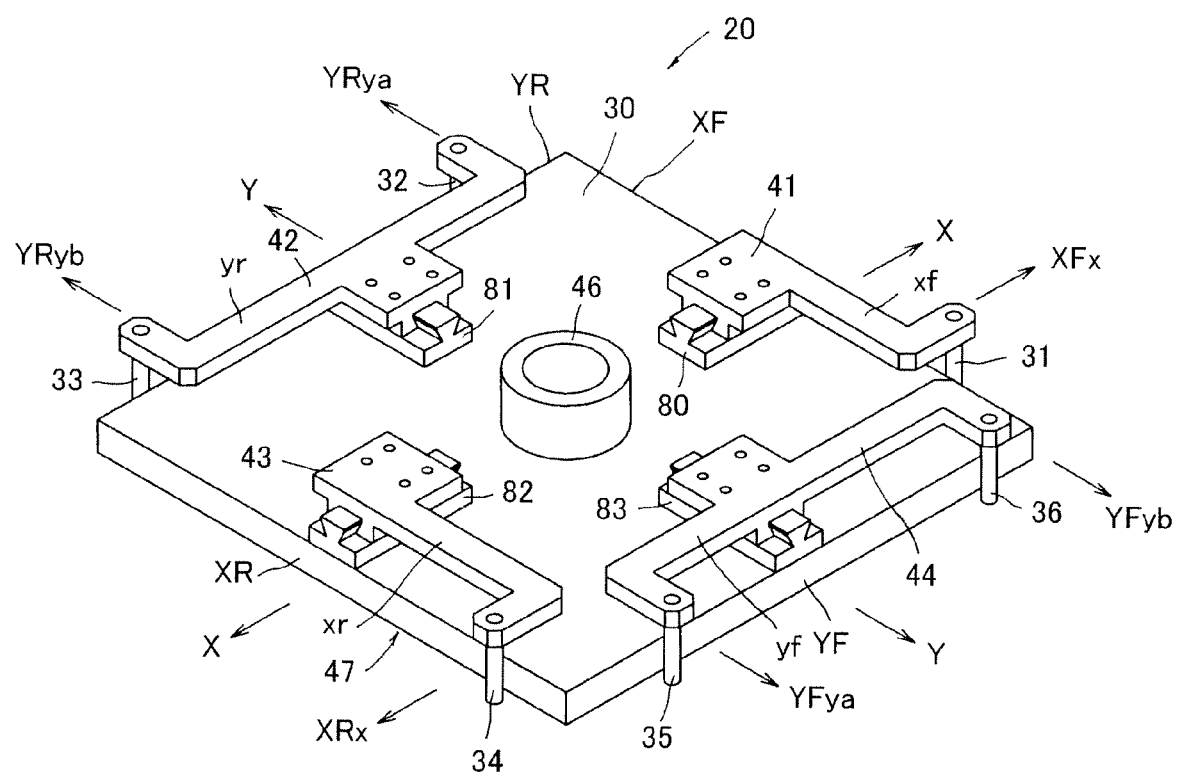
FIG. 3 is a perspective view of a sample-holding device adopted in the sample transfer system illustrated in FIG. 1.

Each sample-holding device 20 configuring the holding device group 21 is a Bernoulli chuck. As illustrated in FIG. 2 and FIG. 3, the sample-holding device 20 is configured of a main body 30, contact pins (contact members) 31, 32, 33, 34, 35, and 36, and movement mechanisms 41, 42, 43, and 44 linearly moving the contact pins in directions along a sample-holding surface 47.

The main body 30 is an approximately square plate, and an air introduction pipe 46 is connected to the center of the main body 30. In the same manner as in a known Bernoulli chuck, as illustrated in FIGS. 9 to 13B, the air introduction pipe 46 passes through from the upper to the lower in the figures. The lower surface in the figure of the main body 30 is a flat surface and functions as the sample-holding surface 47. The area of the sample-holding surface 47 is slightly smaller than the area of the substrate 10, which is a sample. Note that the semiconductor substrate 10 is a solar cell substrate in-process, and is a semiconductor substrate. The substrate 10 has the thickness ranging from 50 μm to 200 μm, and warps when the substrate 10 receives an external force. In a case where at least one side of the substrate 10 is textured, the thickness is measured by using the projecting end of the texture as a reference.

In one or more embodiments of the present invention, the contact pins 31, 32, 33, 34, 35, and 36 are pins circular in cross-section, are provided at respective sides of the main body 30, and are directed in the direction perpendicular to the plane of the main body 30. The lower ends of the contact pins 31, 32, 33, 34, 35, and 36 reach below the sample-holding surface 47. That is, the contact pins 31, 32, 33, 34, 35, and 36 are provided at a peripheral part of the sample-holding surface 47, that is, outside the sample-holding surface 47, and are provided in the direction vertical to the sample-holding surface 47. For the sake of description, the travelling direction of the travelling, lifting, and lowering device 22 is referred to as the Y-axis, and the direction perpendicular to Y-axis is referred to as the X-axis. In addition, the sides of the main body 30 are referred to as a front side in the X direction (hereinafter referred to as an XF side), a rear side in the X direction (hereinafter referred to as an XR side), a front side in the Y direction (hereinafter referred to as a YF side), and a rear side in an F direction (hereinafter referred to as an FR side). As illustrated in FIG. 3, one of the contact pins 31 and 34 is provided at each of the sides in the X direction (XF side and XR side) of the main body 30. That is, the contact pin 31 is provided on the XF side of the main body 30, and the contact pin 34 is provided at the XR side of the main body 30.

In addition, two of the contact pins 32, 33, 35, and 36 are provided at each of the sides in the Y direction (YF side and YR side) of the main body 30. That is, the contact pins 32 and 33 are provided on the YR side of the main body 30, and the contact pins 35 and 36 are provided on the YF side of the main body 30.

The contact pins 31, 32, 33, 34, 35, and 36 provided on the respective sides are supported by pin holders and are suspended downward from the outside of the respective sides of the main body 30. That is, the contact pin 31 arranged on the XF side of the main body 30 is supported by a pin holder xf and is suspended downward from the outside of the XF side of the main body 30. The contact pin 34 arranged on the XR side of the main body 30 is supported by a pin holder xr and is suspended downward from the outside of the XR side of the main body 30. Here, the contact pin 31 arranged on the XF side and the contact pin 34 arranged on the XR side are located at positions shifted from each other in the Y-axis direction in the figure. That is, line XFx in the X-axis direction passing through the contact pin 31 arranged on the XF side does not overlap with line XRx in the X-axis direction passing through the contact pin 34 arranged on the XR side.

Similarly, the contact pins 32 and 33 arranged on the YR side of the main body 30 are supported by a pin holder yr in common, and are suspended downward from the outside of the YR side of the main body 30. The contact pins 35 and 36 arranged on the YF side of the main body 30 are supported by a pin holder yf in common, and are suspended downward from the outside of the YF side of the main body 30.

Here, the contact pins 32 and 33 arranged on the YR side and the contact pins 35 and 36 arranged on the YF side are located at positions shifted from each other in the X-axis direction in the figure. That is, lines YRya and YRyb in the Y-axis direction passing through the contact pins 32 and 33 arranged on the YR side, respectively, do not overlap with lines YFya and YFyb in the Y-axis direction passing through the contact pins 35 and 36 arranged on the YF side, respectively.

In addition, the pin holders xf, yr, xr, and yf are linearly moved by the movement mechanisms 41, 42, 43, and 44, respectively. The movement mechanisms 41, 42, 43, and 44 are configured by linear guides 80, 81, 82, and 83, air cylinders (drive actuators), not illustrated, and link mechanisms, not illustrated, respectively. The pin holders xf, yr, xr, and yf are supported by the linear guides 80, 81, 82, and 83, respectively. The link mechanism, not illustrated, is engaged with each of the pin holders xf, yr, xr, and yf. Therefore, by causing the air cylinders, not illustrated, to operate, the pin holders xf, yr, xr, yf move in the directions perpendicular to the respective sides (XF side, XR side, YF side, and YR side) of the main body 30. That is, by causing drive mechanisms, not illustrated, to operate, the contact pins 31, 32, 33, 34, 35, and 36 provided at the respective sides (XF side, XR side, YF side, and YR side) of the main body 30 move in the directions which are along the sample-holding surface 47 and are perpendicular to the respective sides (XF side, XR side, YF side, and YR side). That is, the contact pins 31, 32, 33, 34, 35, and 36 move in the directions approaching or separating from the respective sides (XF side, XR side, YF side and YR side). Assuming that the sample-holding surface 47 is horizontal, the contact pins 31, 32, 33, 34, 35, and 36 horizontally and linearly move.

In addition, in one or more embodiments of the present invention, two of the pin holders xf, yr, xr, and yf provided on the sides facing each other move in association with each other. Assuming that the pin holder xf provided on the XF side moves in the direction approaching the XF side of the main body 30, also the pin holder xr provided on opposite XR moves in the direction approaching the XR side of the main body 30. Assuming that the pin holder xf provided on the XF side moves in the direction separating from the XF side of the main body 30, also the pin holder xr provided on the opposite XR moves in the direction separating from the XR side of the main body 30. Therefore, assuming that the contact pin 31 provided on the XF side moves in the direction approaching the XF side of the main body 30, also the contact pin 34 provided on the opposite XR moves in the direction approaching the XR side of the main body 30. Assuming that the contact pin 31 provided on the XF side moves in the direction separating from the XF side of the main body 30, also the contact pin 34 provided on the opposite XR moves in the direction separating from the XR side of the main body 30.

Similarly, when the pin holder yr provided on the YR side moves in the direction approaching the YR side of the main body 30 and moves the contact pins 32 and 33 provided on the YR side in the direction approaching the YR side, also the pin holder yf provided on opposite YF moves in the direction approaching the YF side of the main body 30 and moves the contact pins 35 and 36 in the direction approaching the YF side. When the pin holder yr provided on the YR side moves in the direction separating from the YR side of the main body 30 and moves the contact pins 32 and 33 provided on the YR side in the direction separating from the YR side, also the pin holder yf provided on the opposite YF moves in the direction separating from the YF side of the main body 30 and moves the contact pins 35 and 36 in the direction separating from the YF side.

As described above, the holding device group 21 is configured by connecting the five sample-holding devices 20 in series. In one or more embodiments of the present invention, the sample-holding devices 20 are arranged in series in the X-axis direction. Therefore, the XF side of one sample-holding device 20 and the XR side of the sample-holding device 20 adjacent to the one sample-holding device 20 in the X-axis direction face each other. As illustrated in FIG. 2, in the holding device group 21 according to one or more embodiments of the present invention, the contact pins 31 and 34 provided at positions facing each other in the adjacent sample-holding devices, the contact pins 31 and 34 belonging to the adjacent sample-holding devices 20, are in a staggered positional relation. That is, the contact pin 31 arranged on the XF side of each sample-holding device 20 and the contact pin 34 arranged on the XR side are located at positions shifted from each other in the Y-axis direction in the figure, and the sample-holding devices 20 are arranged in series. Therefore, the contact pins 31 and 34 provided at positions facing each other in the adjacent sample-holding devices, the contact pins 31 and 34 belonging to the adjacent sample-holding devices 20, are also located at positions shifted from each other. In other words, line XFx in the X-axis direction passing through the contact pin 31 arranged on the XF side of one sample-holding device 20 does not overlap with line XRx in the X-axis direction passing through the contact pin 34 arranged on the XR side of the adjacent sample-holding device 20.

In addition, in one or more embodiments of the present invention, in a state where the contact pins 31 and 34 provided on the XF side and the XR side of the sample-holding device 20, respectively, have moved to the positions farthest from the XF side and the XR side on which the contact pins 31 and 34 are provided, respectively, the contact pins 31 and 34 are in a positional relation where the distances between the YF side and the YR side of the adjacent sample-holding device 20 and the contact pins 31 and 34, respectively, are shorter than the distances between the XF side and the XR side of the sample-holding device 20 on which the contact pins 31 and 34 are provided and the contact pins 31 and 34, respectively. However, the contact pins 31 and 34 provided at positions facing each other in the adjacent sample-holding devices, the contact pins 31 and 34 belonging to the adjacent sample-holding devices 20, are in a staggered positional relation. Therefore, in a state where the contact pins 31 and 34 provided on the XF side and the XR side of the sample-holding device 20, respectively, have moved to positions farthest from the XF side and the XR side on which the contact pins 31 and 34 are provided, respectively, the contact pins 31 and 34 are shifted from each other and do not collide with each other.

Next, the substrate holder (sample-mounting member) 3 will be described. The substrate holder 3 is a member for mounting the substrate 10 in a CVD device, and similarly to the substrate holder disclosed in Patent Document 2, the substrate holder 3 is vertically disposed. The substrate holder 3 is an approximately square metal plate, black lead (graphite) or the like. In one or more embodiments of the present invention, five substrates 10 can be mounted in each row and column. That is, the substrate holder 3 can mount 25 substrates arranged in a matrix.

Figure 4:
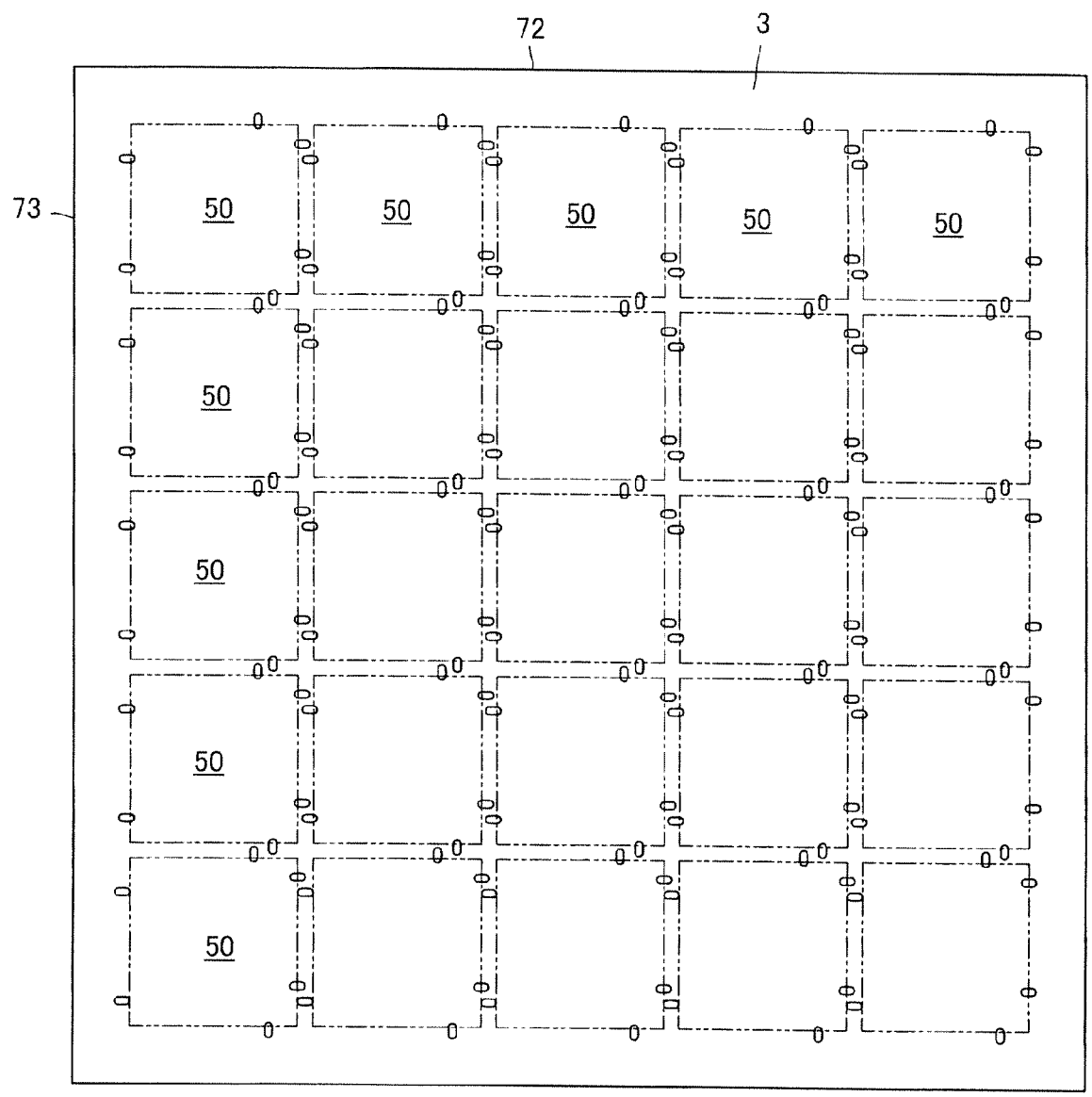
FIG. 4 is a plan view of a substrate holder adopted in the sample transfer system illustrated in FIG. 1.

A predetermined sample-mounting region 50 for mounting the substrate 10 is defined in the substrate holder 3. In one or more embodiments of the present invention, as illustrated in FIG. 4, five predetermined sample-mounting regions 50 are provided in each row and column. The predetermined sample-mounting region 50 can also be described as a portion which the sample-holding surface 47 of the sample-holding device 20 faces when the substrate 10 is attached to or detached from the substrate holder 3. Since the predetermined sample-mounting region 50 is a portion which the sample-holding surface 47 of the sample-holding device 20 faces, the predetermined sample-mounting region 50 is hypothetically a quadrangle. That is, when the substrate 10 is mounted, the sides of the predetermined sample-mounting region 50 match the sides of the substrate 10. Since the sides of the predetermined sample-mounting region 50 which match the sides of the substrate 10 are portions which face the sides of the sample-holding surface 47 of the sample-holding device 20 (in a strict sense, the sides of the predetermined sample-mounting region 50 are shifted a little to the outside), the sides of the predetermined sample-mounting region 50 are referred to as an XF corresponding side, an XR corresponding side, a YF corresponding side, and a YR corresponding side, respectively, for the sake of description. Slot-shaped recessed parts 51, 52, 53, 54, 55, and 56 are provided at the side of each predetermined sample-mounting region 50. The slot-shaped recessed parts 51, 52, 53, 54, 55, and 56 are located at positions corresponding to the above-described contact pins 31, 32, 33, 34, 35, and 36 of the sample-holding device 20.

That is, the recessed part 51 is provided on the XF corresponding side, correspondingly to the contact pin 31 provided on the XF side of the sample-holding device 20. The recessed part 52 is provided on the YR corresponding side, correspondingly to the contact pin 32 provided on the YR side of the sample-holding device 20. The recessed part 53 is provided on the YR side corresponding side, correspondingly to the contact pin 33 provided on the YR side of the sample-holding device 20. The recessed part 54 is provided on the XR corresponding side, correspondingly to the contact pin 34 provided on the XR side of the sample-holding device 20. The recessed part 55 is provided on the YF side corresponding side, correspondingly to the contact pin 35 provided on the YF side of the sample-holding device 20. The recessed part 56 is provided on the YR side corresponding side, correspondingly to the contact pin 36 provided on the YF side of the sample-holding device 20.

The length and the direction of the slot of each of the recessed parts 51, 52, 53, 54, 55, and 56 are the length and the direction including a movement margin of each of the contact pins 31, 32, 33, 34, 35, and 36 of the sample-holding device 20. That is, the slots of the recessed parts 51, 52, 53, 54, 55, and 56 extend in the directions perpendicular to one of the XF corresponding side, the XR corresponding side, the YF corresponding side, and the YR corresponding side. In addition, the length of each slot is longer than the movement distance of each of the contact pins 31, 32, 33, 34, 35, and 36. Furthermore, the width of each slot is greater than the diameter of each of the contact pins 31, 32, 33, 34, 35, and 36.

As described above, the predetermined sample-mounting regions 50 are arranged in rows and columns in a matrix. The XF corresponding side of one predetermined sample-mounting region 50 faces the XR correspondence side of the adjacent sample-holding device 20 in the X direction. The recessed parts 51 and 54 located at positions facing each other in the X-direction are in a staggered positional relation. That is, the recessed part 51 arranged on the XF corresponding side of the predetermined sample-mounting region 50 and the recessed part 54 arranged on the XR corresponding side are located at positions shifted from each other in the Y-axis direction in the figure, and the predetermined sample-mounting regions 50 are arranged in series. Therefore, the recessed parts 51 and 54 provided at positions facing each other in the adjacent predetermined sample-mounting regions 50, the recessed parts 51 and 54 belonging to the adjacent predetermined sample-mounting regions 50, are also located at positions shifted from each other. In addition, the position in the slot (recessed part 51, 54) farthest from the XF corresponding side on which the slot is provided is in a positional relation where the distance from the XR corresponding side of the adjacent predetermined sample-mounting region 50 is shorter than the distance from the XF corresponding side on which the slot is provided. However, the recessed parts 51 and 54 provided at positions facing each other in the predetermined sample-mounting regions 50 adjacent in the X direction, the recessed parts 51 and 54 belonging to the adjacent sample-holding devices 20, are in a staggered positional relation. Therefore, the recessed parts 51 and 54 are shifted from each other, and are not connected to each other.

The relation between the predetermined sample-mounting regions 50 adjacent to each other in the Y-axis direction is similar. The recessed parts 55 and 56 arranged on the YF corresponding side of the predetermined sample-mounting region 50 and the recessed parts 52 and 53 arranged on the YR corresponding side are located at positions shifted from each other in the X-axis direction in the figure, and the predetermined sample-mounting regions 50 are arranged in series in the Y direction. Therefore, two of the recessed parts 52, 53, 55, and 56 provided at positions facing each other in the adjacent predetermined sample-mounting regions 50, the two of the recessed parts 52, 53, 55, and 56 belonging to the adjacent predetermined sample-mounting regions 50, are also located at positions shifted from each other. Two of the recessed parts 52, 53, 55, and 56 provided at positions facing each other in the predetermined sample-mounting regions 50 adjacent to each other in the Y direction, the recessed parts 52, 53, 55, and 56 belonging to the adjacent sample-holding devices 20, are in a staggered positional relation. Therefore, the recessed part 52 and the recessed part 56 of the adjacent predetermined sample-mounting region 50 are shifted from each other and are not connected to each other. The recessed part 53 and the recessed part 55 of the adjacent predetermined sample-mounting region 50 are shifted from each other and are not connected to each other.

In addition, sample-supporting members 60, 61, and 62 are provided near each predetermined sample-mounting region 50. Among the three sample-supporting members 60, 61, and 62, two sample-supporting members 61 and 62 are located near the XR corresponding side. Note that among them, the sample-supporting member 61 is located at a position separating from the XR corresponding side in the X direction. The remaining sample-supporting member 60 is located at a position near the YR corresponding side and outside the YR corresponding side.

Figure 8:
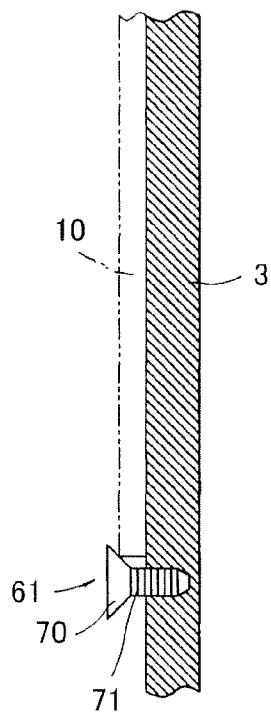
FIG. 8 is a cross-sectional view taken along A-A in FIG. 5 in a case where the orientation of the substrate holder is vertical.

In one or more embodiments of the present invention, as illustrated in FIG. 8, the sample-supporting member 60 is a flat countersunk head screw, and includes a head 70 and a shaft 71. The rear side of the head 70 of the sample-supporting member 60 is tapered. Therefore, the front-end portion (head 70) of the sample-supporting member 60 is larger in cross-section than the other portion (shaft 71), and the front-end portion (head 70) is greater in cross-section as it separates from the main body portion of the substrate holder 3.

Next, operation of the sample transfer system 1 according to one or more embodiments of the present invention will be described. As described above, the sample transfer system 1 according to one or more embodiments of the present invention is a system in which the substrate 10 which has been conveyed by the carry-in conveyor 2 is moved and transferred to the substrate holder (sample-mounting member) 3 by the sample-moving device 5, and then the substrate 10 is detached from the substrate holder 3 and is transferred to another device.

In one or more embodiments of the present invention, the substrate holder 3 is initially mounted in a horizontal orientation. In one or more embodiments of the present invention, the substrates 10 are sequentially conveyed by the carry-in conveyor 2. Then, five substrates 10 are sucked by the sample-holding devices 20, the sample-holding device group 21 is moved by the travelling, lifting, and lowering device 22, and the substrate holder 3 carries the substrates 10. Since five rows and columns of substrates 10 are mounted on the substrate holder 3 according to one or more embodiments of the present invention, the sample-holding device group 21 moves back and forth five times, and the substrates 10 are mounted in all the predetermined sample-mounting regions 50 of the substrate holder 3.

Figure 5:
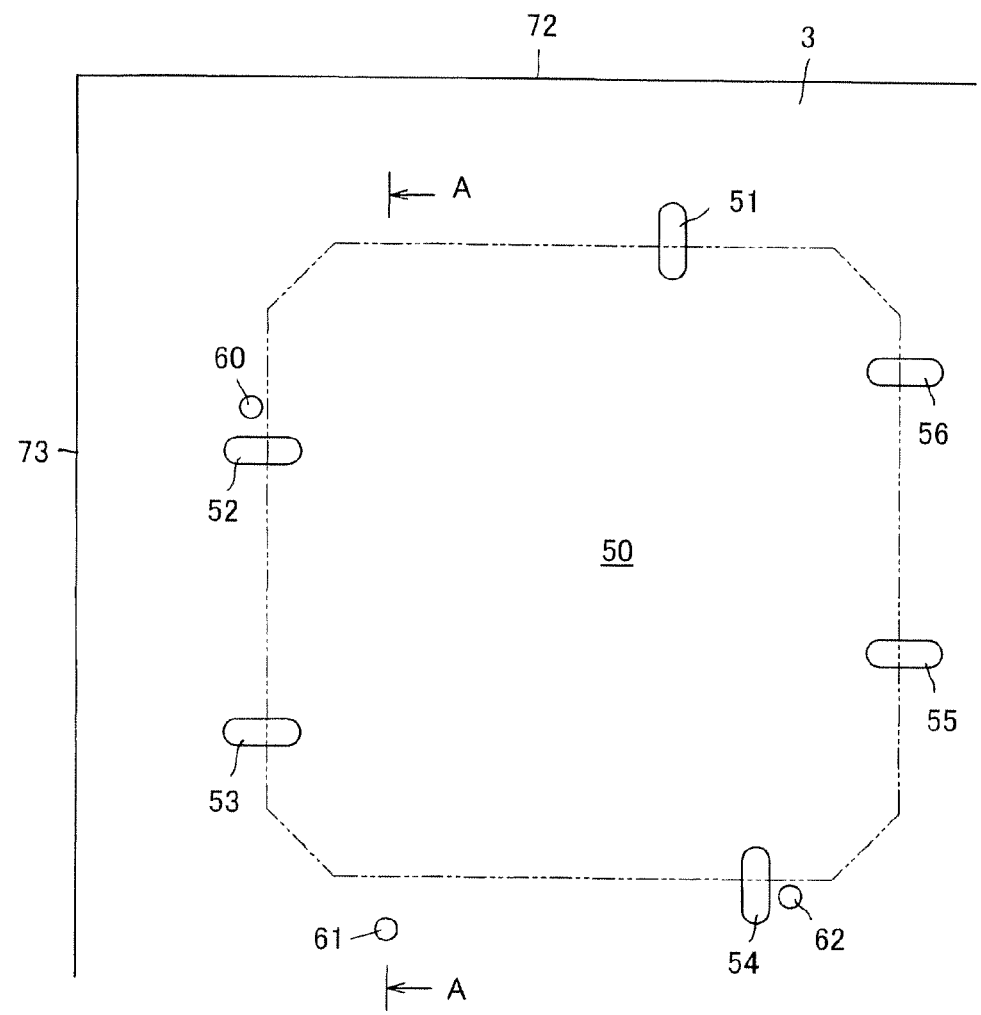
FIG. 5 is a plan view of one predetermined sample-mounting region, recessed parts corresponding to the predetermined sample-mounting region, and sample-supporting members of the substrate holder.
Figure 6:
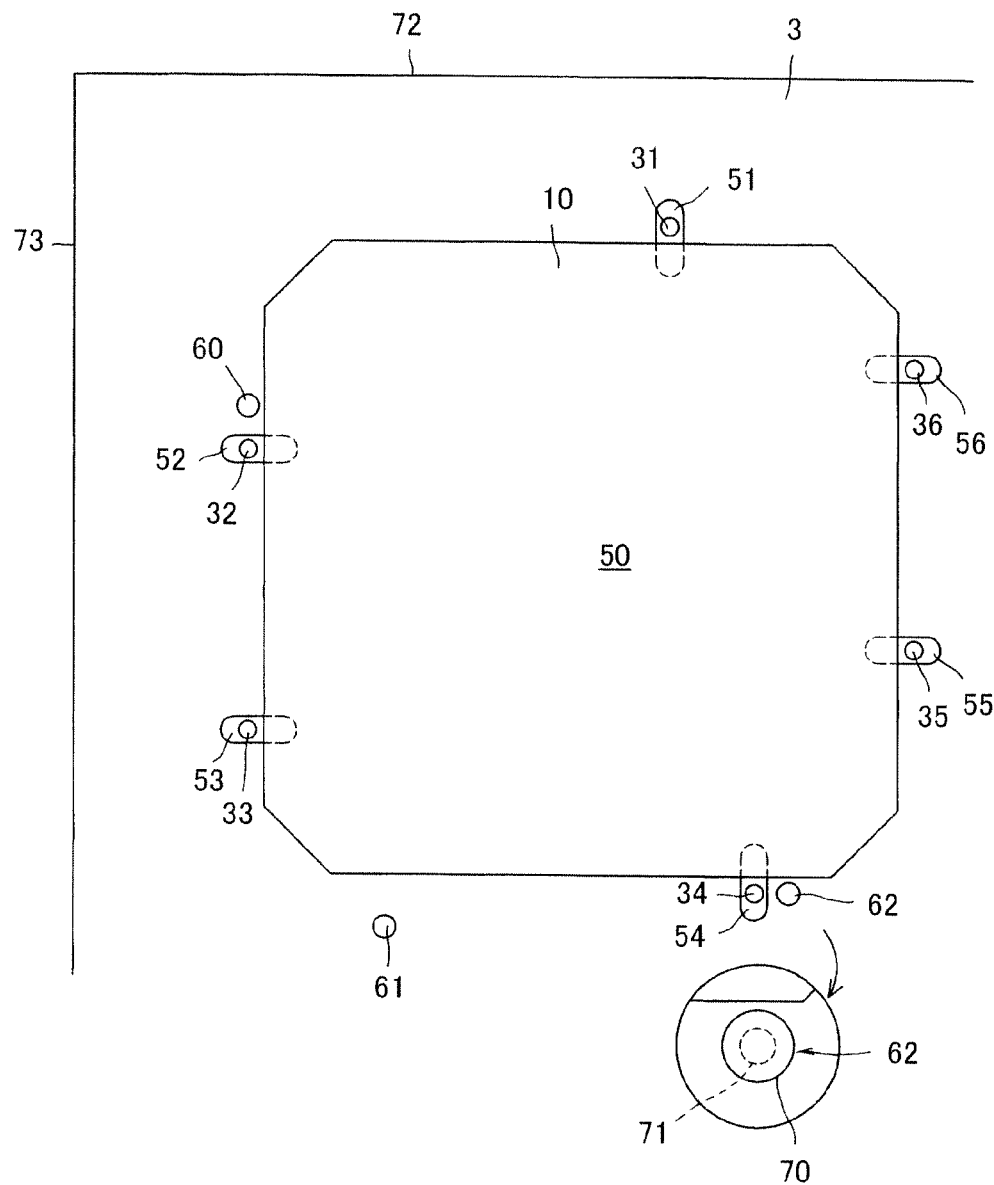
FIG. 6 is a plan view illustrating a state where a substrate is mounted in the predetermined sample-mounting region illustrated in FIG. 5.
Figure 7:
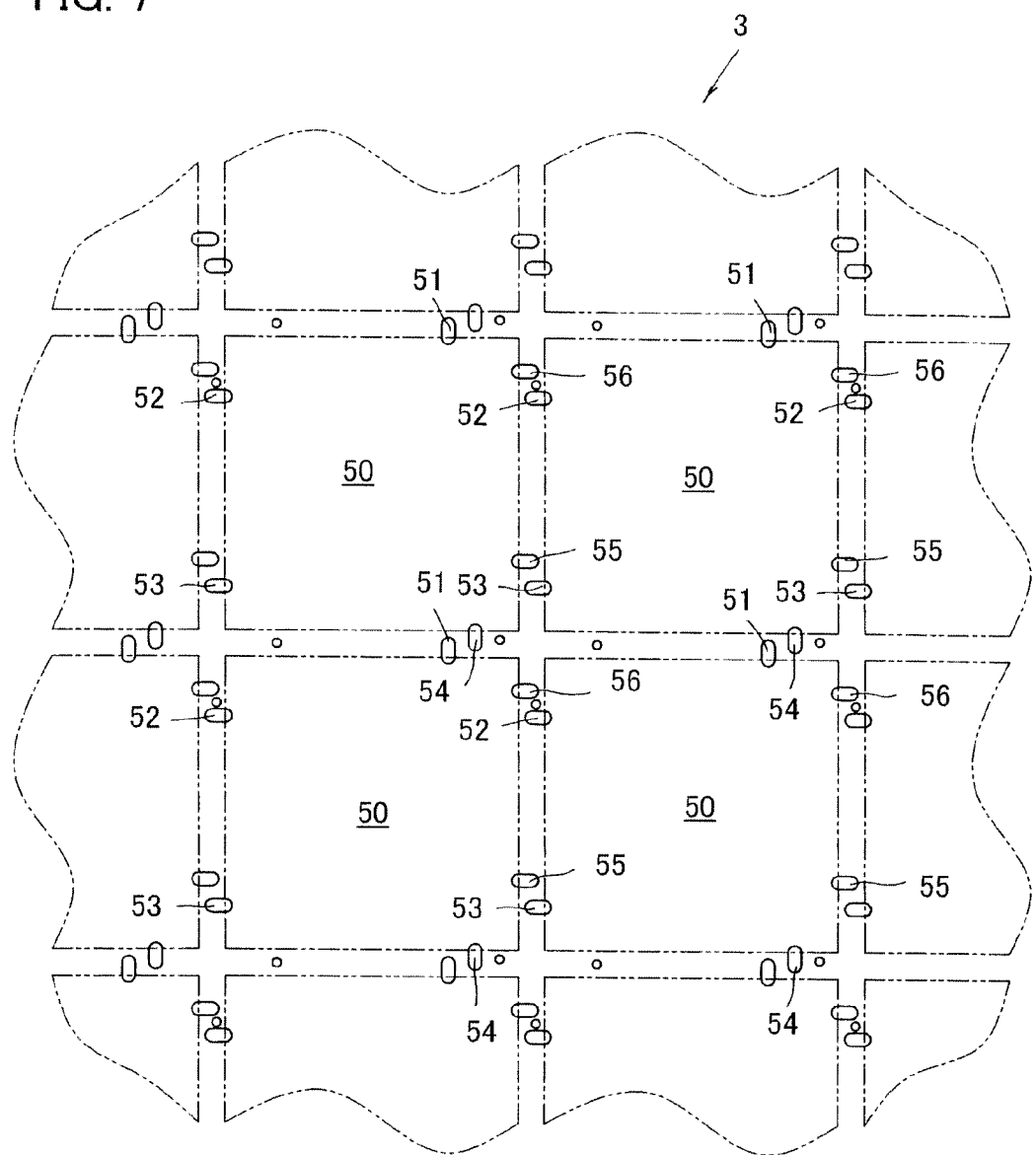
FIG. 7 is an enlarged plan view of the substrate holder illustrated in FIG. 4.

Here, the orientation of the substrate 10 mounted in the predetermined sample-mounting region 50 is as illustrated in FIG. 5. All the sides of the substrate 10 are parallel to an side 72 or 73 of the substrate holder 3, the sides of the substrate 10 cross the slot-shaped recessed parts 51, 52, 53, 54, 55, and 56. In addition, none of the shafts 71 of the three sample-supporting members 60, 61, and 62 is in contact with the substrate 10 as illustrated in FIG. 5. That is, the sides of the substrate 10 are not engaged with the heads 70 of the sample-supporting members 60, 61, and 62.

Figure 14:
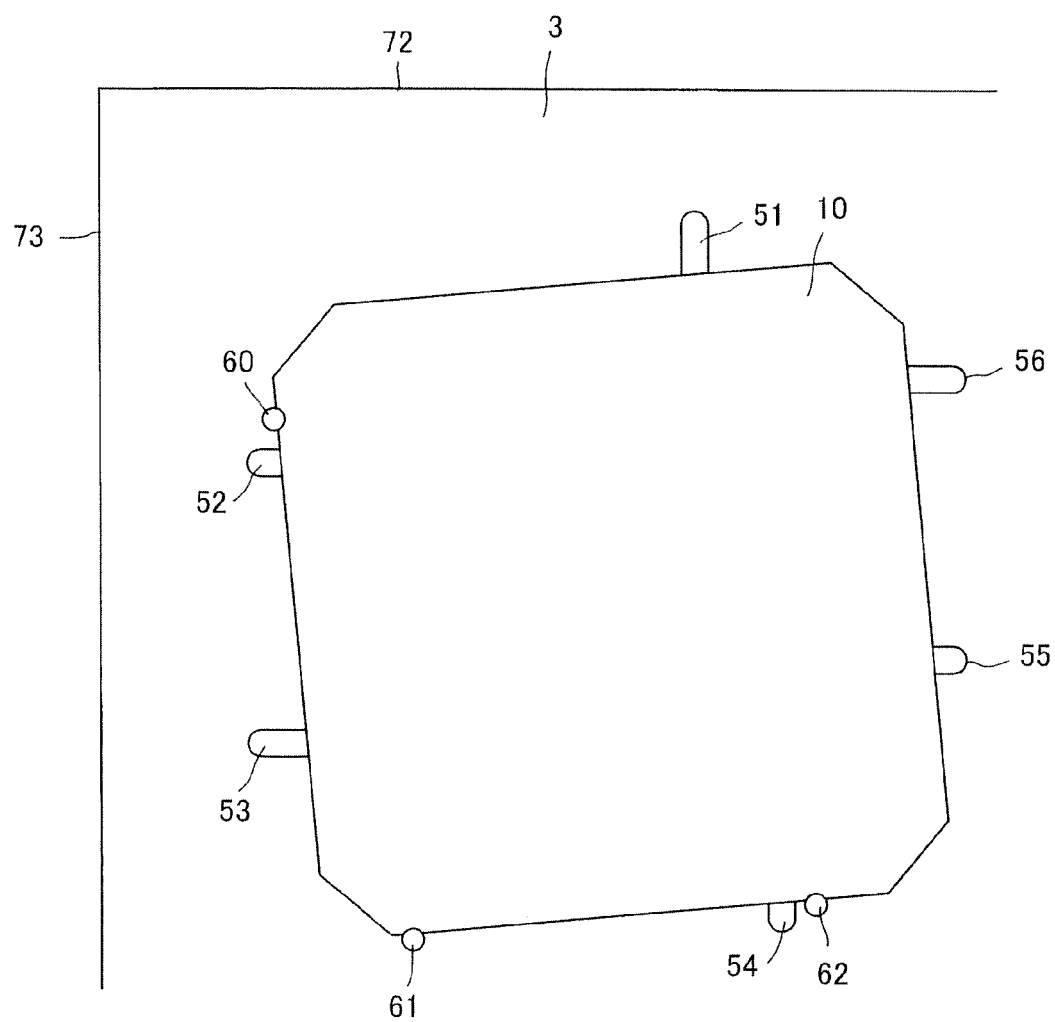
FIG. 14 is a plan view illustrating the orientation of the substrate immediately after the substrate holder is taken out from a CVD device.

After the substrates 10 have been mounted in all the predetermined sample-mounting regions 50, the orientation of the substrate holder 3 is changed into vertical by a raising device, not illustrated. As a result, the up-down direction of the substrate 10 is changed, the XF corresponding side of the substrate 10 becomes upside, and the XR corresponding side of the substrate 10 becomes downside. Therefore, the direction of gravity acting on the substrate 10 changes, and the substrate 10 is shifted by its own weight. However, since the two sample-supporting members 61 and 62 are provided on the lower side of the substrate 10, the substrate 10 is prevented from falling. Here, in one or more embodiments of the present invention, the two sample-supporting members 61 and 62 are located at different heights when the orientation of the substrate 10 becomes vertical. In addition, the sample-supporting member 60 provided near the YR corresponding side of the substrate 10 is located at a position outside the YR corresponding side, and the sample-supporting member 60 is separated from the side of the substrate 10 when the orientation of the substrate holder 3 is horizontal. Therefore, when the orientation of the substrate holder 3 is changed from horizontal to vertical, the substrate 10 moves downward and turns around the sample-supporting member 62 acting as a fulcrum. As illustrated in FIG. 14, the orientation of the substrate 10 is inclined as a whole. In addition, since each of the sample-supporting members 61 and 62 is a flat countersunk head screws and the inner surface of the head 70 is tapered, the end of the substrate 10 is engaged with the inside of the head 70 of the screw as illustrated in FIG. 8. Therefore, the substrate 10 is prevented from moving in the direction separating from the substrate holder 3. That is, as illustrated in FIG. 8, each of the sample-supporting members 61 and 62 has a section raised upward in the up-down direction and provided outside (in the direction separating from the predetermined sample-mounting region 50) the section in contact with the substrate 10. Therefore, the substrate 10 is less likely to be separated from the substrate holder 3.

In this state, the substrate holder 3 is carried into the CVD device, and an amorphous semiconductor film or the like is formed. After film formation, the substrate holder 3 is taken out from the CVD device, and is again placed in the horizontal orientation. Then, the substrate 10 is detached from the substrate holder 3, and is fed to a device used in the next process by the sample transfer system 1 according to one or more embodiments of the present invention. Hereinafter, this process will be described.

The substrate holder 3 is taken out from the CVD device, and is placed again in the horizontal orientation. The orientation of the substrate 10 remains inclined as illustrated in FIG. 14. In addition, the side of the substrate 10 is engaged with the insides of the heads 70 of the flat countersunk head screws, which are the sample-supporting members 61 and 62. Therefore, when the substrate 10 is pulled straight up, the side of the substrate 10 is caught by the head 70 of the screw, and the substrate 10 is damaged.

In contrast, the sample-holding device 20 adopted in one or more embodiments of the present invention executes specific operation and disengages the substrate 10 from the sample-supporting members 61 and 62. That is, the travelling motor of the travelling, lifting, and lowering device 22 is driven, the sample-holding device 20 is moved in the Y direction, and the sample-holding device 20 is moved to the position right above the substrate 10 as illustrated in FIG. 9.

Figure 9:
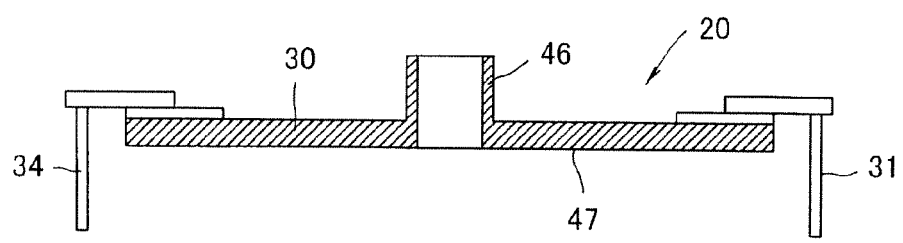
FIG. 9 is a cross-sectional view illustrating a state where the substrate on the substrate holder is held and lifted by the sample-holding device.
Figure 9:
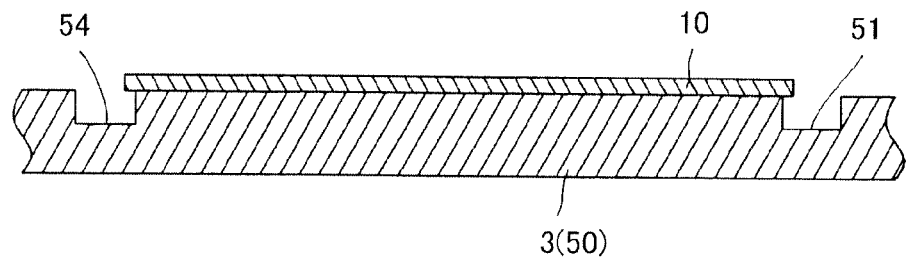
Figure 10:
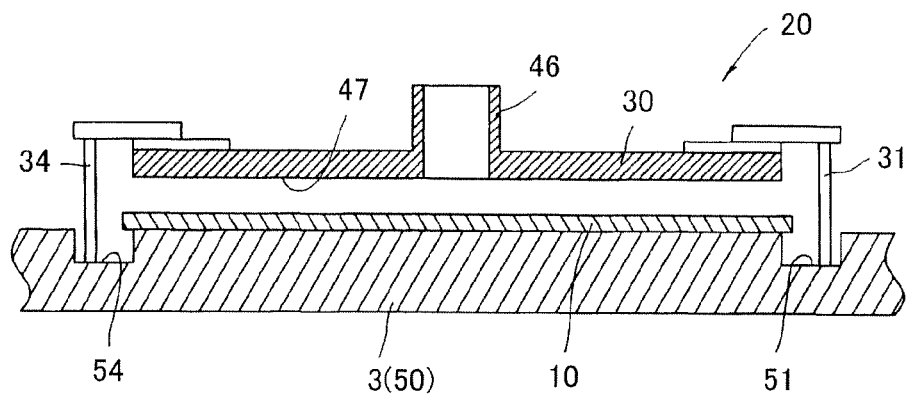
FIG. 10 is a cross-sectional view illustrating a state where the substrate on the substrate holder is held and lifted by the sample-holding device, which illustrates a step subsequent to the state illustrated in FIG. 9.
Figure 11:
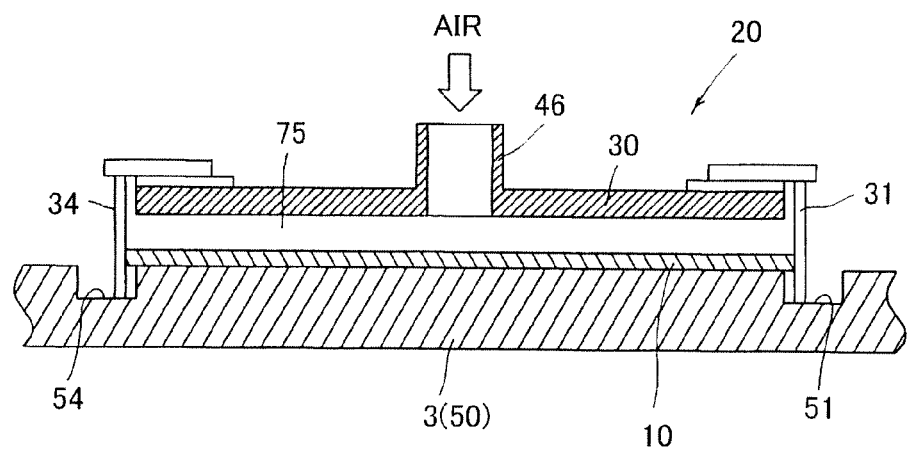
FIG. 11 is a cross-sectional view illustrating a state where the substrate on the substrate holder is held and lifted by the sample-holding device, which illustrates a step subsequent to the state illustrated in FIG. 10.

Note that at that time, the contact pins 31, 32, 33, 34, 35, and 36 have been moved in advance in directions separating from each other as illustrated in FIG. 9. That is, the contact pins 31, 32, 33, 34, 35, and 36 have been moved in advance such that the contact pins are separated most from the sides where the contact pins are provided. Then, the lifting and lowering motor of the travelling, lifting, and lowering device 22 is driven to lower the sample-holding device 20 and the main body 30 of the sample-holding device 20 is placed over the substrate 10 as illustrated in FIG. 10. That is, the sample-holding surface 47 of the sample-holding device 20 faces the substrate 10. However, since the orientation of the substrate 10 is inclined and the substrate 10 is shifted toward the sample-supporting members 61 and 62, the sample-holding surface 47 is not face-to-face with the substrate 10 (FIG. 15A).

Here, the contact pins 31, 32, 33, 34, 35, and 36 are extended from the peripheral part of the main body 30, and the recessed parts 51, 52, 53, 54, 55, and 56 are provided in the substrate holder 3 correspondingly to the positions of the contact pins 31, 32, 33, 34, 35, and 36. Therefore, the contact pins 31, 32, 33, 34, 35, and 36 enter the corresponding recessed parts 51, 52, 53, 54, 55, and 56. Therefore, the heights of the contact pins 31, 32, 33, 34, 35, and 36 are offset by the depths of the recessed parts 51, 52, 53, 54, 55, and 56, and the sample-holding surface 47 of the sample-holding device 20 can be brought immediately close to the substrate 10.

In one or more embodiments of the present invention, in this state, each of the contact pins 31, 32, 33, 34, 35, and 36 is moved horizontally in the direction toward the side where the contact pin is provided. Note that in one or more embodiments of the present invention, since the recessed parts 51, 52, 53, 54, 55, and 56 are slots and are long in the movement directions of the contact pins 31, 32, 33, 34, 35, and 36, respectively, the front ends of the contact pins 31, 32, 33, 34, 35, and 36 can move horizontally in the recessed parts 51, 52, 53, 54, 55, and 56, respectively. Therefore, each of the contact pins 31, 32, 33, 34, 35, and 36 moves horizontally without trouble.

Figure 12A:
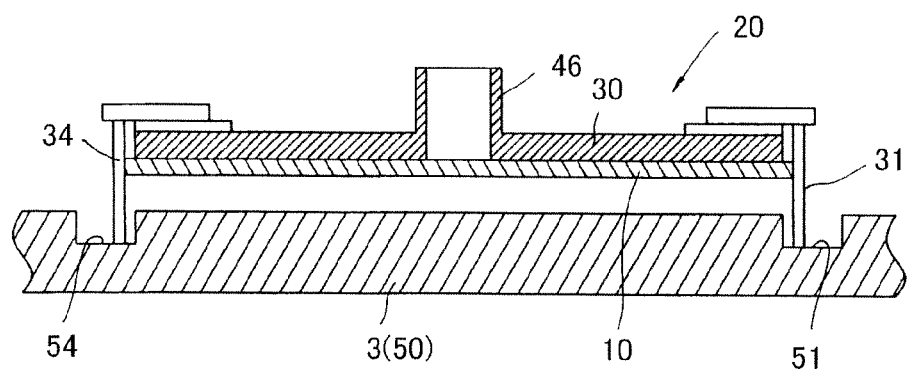
Figure 12B:
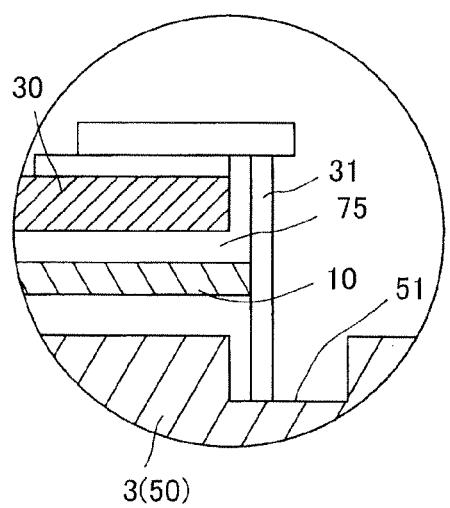
Figure 13A:
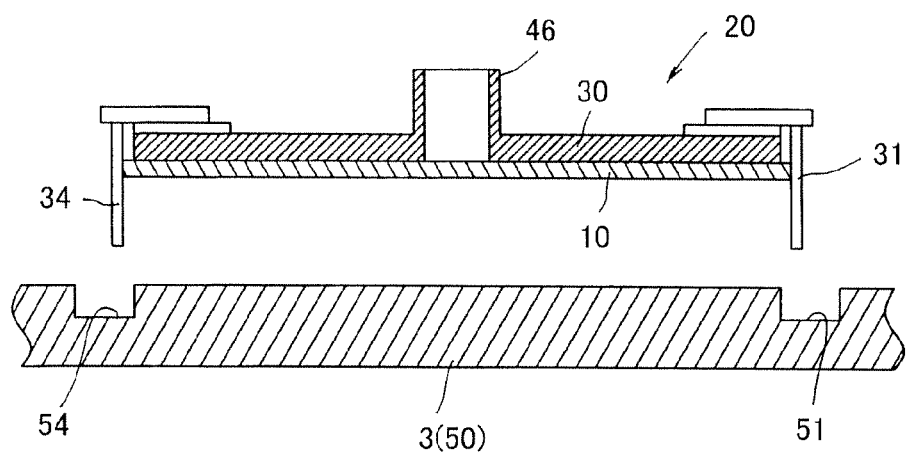
Figure 13B:
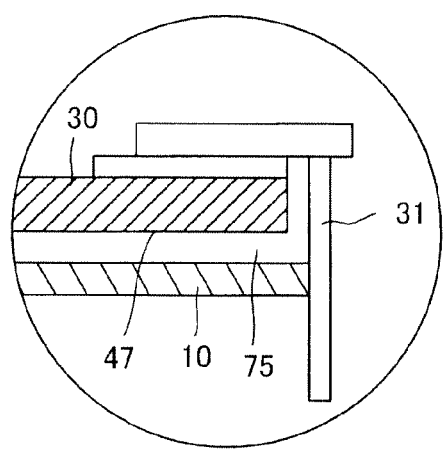
Figure 15A:
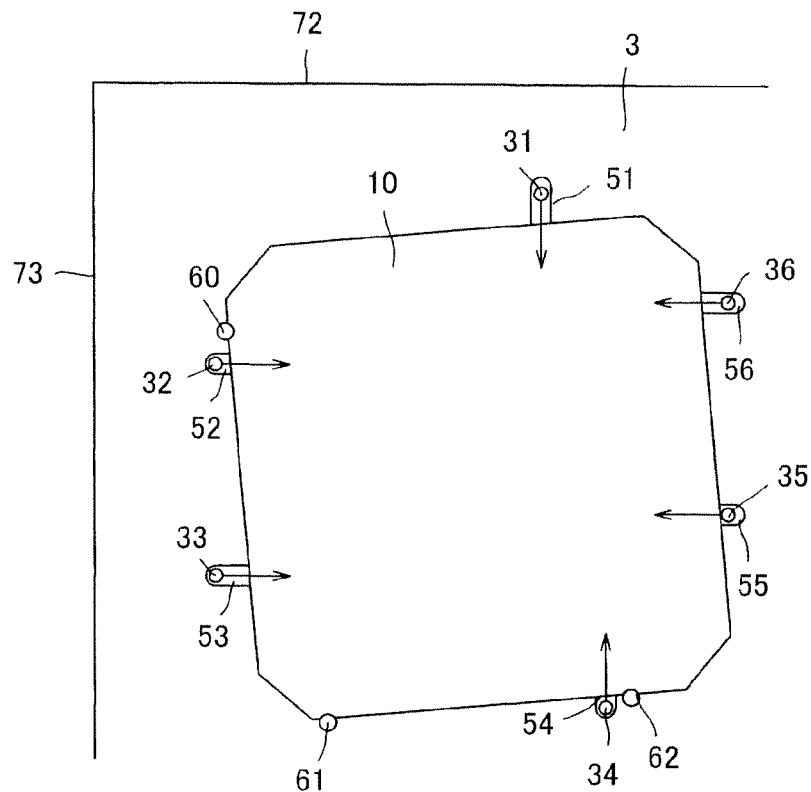
Figure 15B:
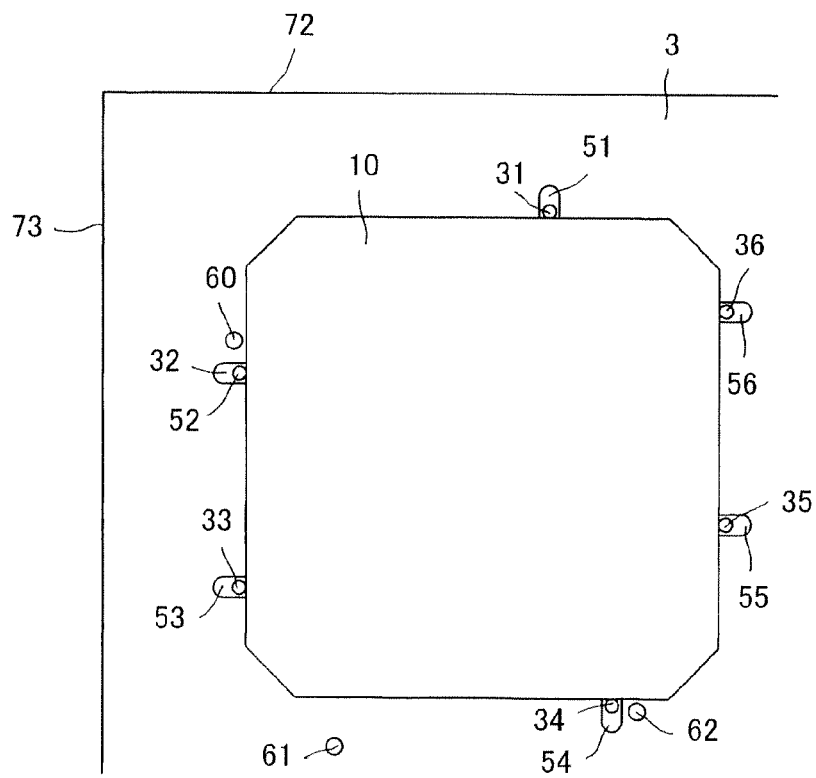

As a result, the side of the substrate 10 is pressed by the contact pins 31, 32, 33, 34, 35, and 36 as indicated by arrows illustrated in FIG. 15A, the substrate 10 horizontally moves and rotatably moves as illustrated in FIG. 15A, and the substrate 10 is disengaged from the sample-supporting members 61 and 62. In addition, the orientation of the substrate 10 is corrected from the inclined orientation to a straight orientation. That is, the inclined orientation of the substrate 10 is corrected to be straight, and the sides of the substrate 10 are parallel to the side 72 or 73 of the substrate holder 3. Therefore, the orientation of the plane of the substrate 10 matches the orientation of the plane of the sample-holding surface 47 of the sample-holding device 20. That is, the sides of the sample-holding device 20 are parallel to the sides of the substrate 10. Then, air is fed to the air introduction pipe 46 as indicated by an arrow illustrated in FIG. 11, a space 75 between the sample-holding surface 47 and the substrate 10 is ventilated, and the pressure in the space 75 is made negative. As a result, the substrate 10 is sucked toward the sample-holding surface 47 as illustrated in FIG. 12B. Note that in reality, there is a gap where air passes through between the sample-holding surface 47 and the substrate 10 as illustrated in FIG. 12B, and the sample-holding surface 47 and the substrate 10 are not in contact with each other. However, for the sake of drawing and description, in FIG. 12A, which is an entire view, the sample-holding surface 47 and the substrate 10 are illustrated to be in contact with each other. The same applies to FIGS. 13A and 13B.

After that, the lifting and lowering motor of the travelling, lifting, and lowering device 22 is driven and the sample-holding device 20 is lifted upward. Furthermore, the travelling motor of the travelling, lifting, and lowering device 22 is driven and the sample-holding device 20 is moved horizontally, and the substrate 10 is conveyed to a desired position. Here, in one or more embodiments of the present invention, since the contact pins 31, 32, 33, 34, 35, and 36 are located around the sample-holding surface 47 and the side surfaces of the substrate is loosely held by the contact pins 31, 32, 33, 34, 35, and 36, the substrate 10 will not move in the planar direction during transfer.

Next, a solar cell 100 manufactured by a manufacturing method according to one or more embodiments of the present invention will be described. Note that the present invention is not limited to the following embodiments.

Figure 16:
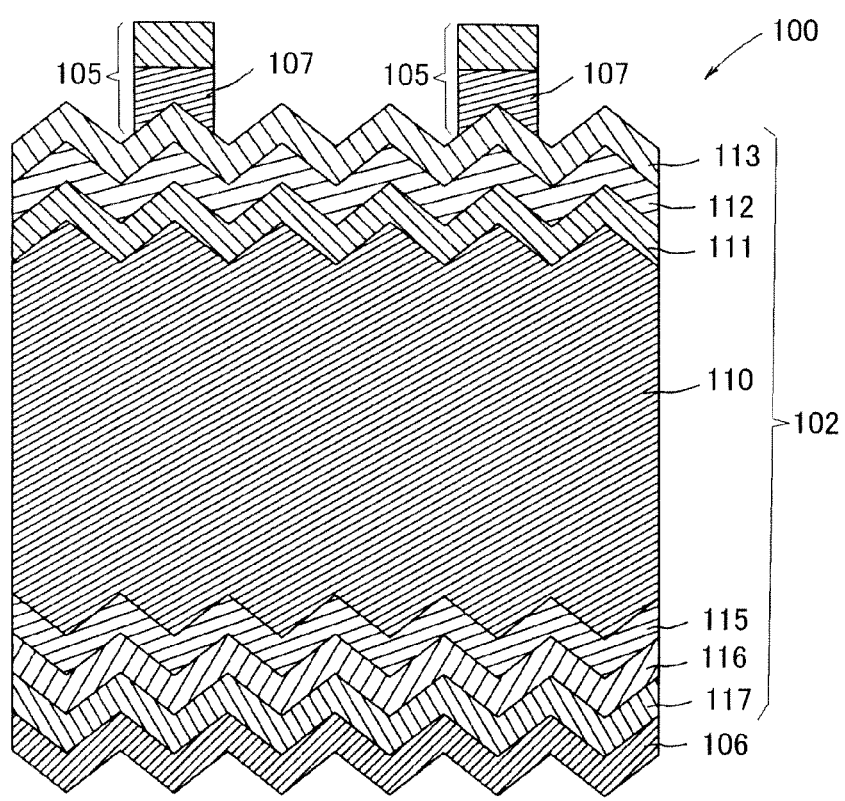
FIG. 16 is a cross-sectional view of a solar cell.

The solar cell 100 is a crystalline silicon solar cell including a crystalline silicon substrate as a support substrate. Specifically, the solar cell 100 is a heterojunction crystalline silicon solar cell (hereinafter also referred to as "heterojunction solar cell"). As illustrated in FIG. 16, the solar cell 100 includes a collector electrode 105 on one main surface (first main surface) of a photoelectric conversion substrate 102. In addition, the solar cell 100 includes a rear-surface electrode layer 106 on the other main surface (second main surface) of the photoelectric conversion substrate 102.

The photoelectric conversion substrate 102 is a photoelectric conversion unit which can convert light energy into electrical energy, and is a plate-shaped substrate extending in a plane. The photoelectric conversion substrate 102 is formed by laminating a plurality of layers on both surfaces of a crystalline silicon substrate 110, and includes a PIN junction or a PN junction as a whole. Specifically, as illustrated in FIG. 16, in the photoelectric conversion substrate 102, an i-type amorphous silicon-based thin film 111, a p-type amorphous silicon-based thin film 112, and a first transparent electrode layer 113 (transparent conductive oxide layer) are laminated on one main surface (surface on the light incident side) of the n-type single-crystalline silicon substrate 110. In addition, in the photoelectric conversion substrate 102, an i-type amorphous silicon-based thin film 115, an n-type amorphous silicon-based thin film 116, and a second transparent electrode layer 117 are laminated on the other main surface (surface on the rear side) of the n-type single-crystalline silicon substrate 110.

As illustrated in FIG. 16, in the photoelectric conversion substrate 102, texture structures are formed on both surfaces of the n-type single-crystalline silicon substrate 110. The texture structures are reflected on the outer layers, and the texture structures are formed on both surfaces of the photoelectric conversion substrate 102 as a whole.

The n-type single-crystalline silicon substrate 110 is a semiconductor substrate, and is a single-crystalline silicon substrate containing an atom (for example, a phosphorus atom) for introducing an electron into a silicon atom.

The i-type amorphous silicon-based thin film 111 is a semiconductor layer, and is an intrinsic silicon layer to which an impurity such as phosphorus or boron is not added. For example, an i-type hydrogenated amorphous silicon layer made of silicon and hydrogen can be adopted.

The i-type amorphous silicon-based thin film 115 is a semiconductor layer, and is an intrinsic silicon layer to which an impurity such as phosphorus or boron is not added.

For example, an i-type hydrogenated amorphous silicon layer made of silicon and hydrogen can be adopted.

The p-type amorphous silicon-based thin film 112 is a semiconductor layer, and is a silicon layer containing an atom (for example, a boron atom) for introducing a hole into a silicon atom. For example, a p-type hydrogenated amorphous silicon layer, a p-type amorphous silicon carbide layer, or a p-type amorphous silicon oxide layer can be adopted.

The n-type amorphous silicon-based thin film 116 is a semiconductor layer, and is a silicon layer containing an atom (for example, a phosphorus atom) for introducing an electron into a silicon atom. For example, an n-type amorphous silicon layer can be adopted.

The first transparent electrode layer 113 is a transparent conductive film, and is a layer having light-transmissivity and conductivity. The constituent material of the first transparent electrode layer 113 is not particularly limited as long as the constituent material has light-transmissivity and conductivity. For example, the first transparent electrode layer 113 is made of a transparent conductive oxide such as an indium tin oxide (ITO), an indium zinc oxide (IZO), a tin oxide ($SnO_2$), or a zinc oxide (ZnO). Note that the first transparent electrode layer 113 may be obtained by adding a dopant to the above-described transparent conductive oxide.

The second transparent electrode layer 117 is a transparent conductive film, and is a layer having light-transmissivity and conductivity. The second transparent electrode layer 117 is not particularly limited as long as the constituent material has light-transmissivity and conductivity. For example, the second transparent electrode layer 117 is made of a transparent conductive oxide such as an indium tin oxide (ITO), an indium zinc oxide (IZO), a tin oxide ($SnO_2$), or a zinc oxide (ZnO). Note that the second transparent electrode layer 117 may be obtained by adding a dopant to the above-described transparent conductive oxide.

Subsequently, an outline of a manufacturing method for the solar cell 100 according to one or more embodiments of the present invention will be described. The solar cell 100 is manufactured by using a sputtering device, a CVD device, a plating device and the like, not illustrated. The sample transfer system 1 according to one or more embodiments of the present invention is utilized when a substrate, which is a sample, is transferred between the devices. In a process not illustrated, the n-type single-crystalline silicon substrate 110 on which the texture structure is formed (hereinafter referred to as a solar cell substrate 101 in-process, including the processed n-type single-crystalline silicon substrate 110 and a laminate body on the n-type single-crystalline silicon substrate 110) is manufactured. Then, the solar cell substrate 101 in-process is held by the sample-holding device 20 of the sample transfer system 1 according to one or more embodiments of the present invention, and the solar cell substrate 101 in-process is equipped on the CVD device, not illustrated, directly or by using another transfer device in combination. That is, a substrate holding process of holding the solar cell substrate 101 in-process by the sample-holding device 20 is included in the manufacturing processes.

Figure 17A:
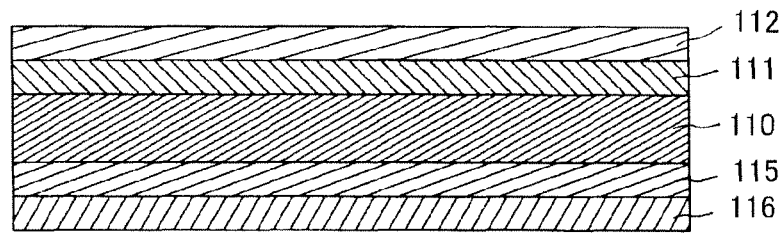

Then, as illustrated in FIG. 17A, the silicon-based thin films 111, 112, 115, and 116 are formed on the front and rear surfaces of the n-type single-crystalline silicon substrate 110 by a plasma CVD method. That is, the i-type amorphous silicon-based thin film 111 and the p-type amorphous silicon-based thin film 112 are formed on one main surface of the n-type single-crystalline silicon substrate 110, and the i-type amorphous silicon-based thin film 115 and the n-type amorphous silicon-based thin film 116 are formed on the other main surface (silicon layer formation process).

Figure 17B:
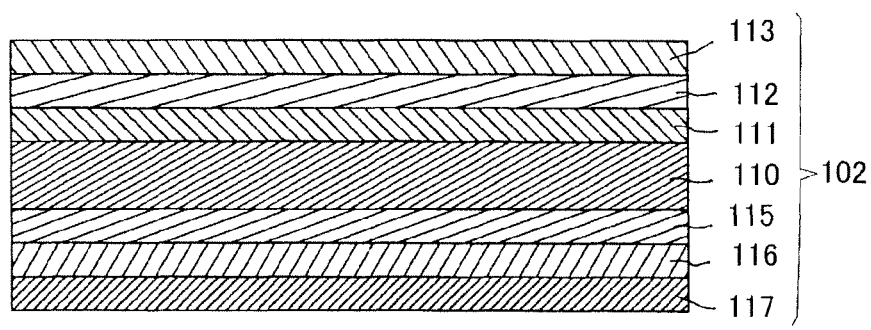

Then, when the silicon-based thin films 111, 112, 115, and 116 have been formed on the n-type single-crystalline silicon substrate 110, the solar cell substrate 101 in-process is transferred to the sputtering device. Also in this case, the solar cell substrate 101 in-process is held by the sample-holding device 20 according to one or more embodiments of the present invention, and is equipped on the sputtering device, not illustrated, directly or by using another transfer device in combination. In the sputtering device, the transparent electrode layers 113 and 117 are formed on the front and rear surfaces of the solar cell substrate 101 in-process, respectively, as illustrated in FIG. 17B. That is, the first transparent electrode layer 113 is formed on the p-type amorphous silicon-based thin film 112 of the photoelectric conversion substrate 102, and the second transparent electrode layer 117 is formed on the n-type amorphous silicon-based thin film 116 of the solar cell substrate 101 in-process (transparent electrode layer formation process).

Figure 17C:
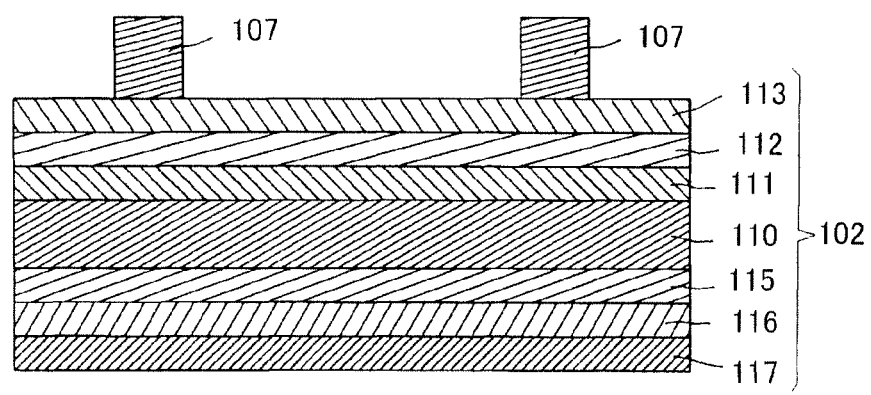

Then, the solar cell substrate 101 in-process is transferred from the sputtering device to a printing device. Also in this case, the substrate holding process of holding the solar cell substrate 101 in-process by the sample-holding device 20 according to one or more embodiments of the present invention is performed. Then, in the printing device, a base electrode layer 107 is formed by a screen printing method on the surface of the solar cell substrate 101 in-process as illustrated in FIG. 17C. Then, an insulating layer, not illustrated, is provided on the solar cell substrate 101 in-process (an opening exists on the base electrode layer), a plating layer is formed on the base electrode layer, and the collector electrode 105 is formed. Note that as the collector electrode and the rear-surface electrode layer, paste may be printed or a plating layer may be formed by a plating method. For example, as the collector electrode, a plating layer may be formed after formation of the base electrode layer 107. In that case, the holding device according to one or more embodiments of the present invention may be used since deposition of plating on a non-desired spot can be suppressed. In FIG. 16, the rear-surface electrode layer is formed on the entire rear surface; however, the rear-surface electrode layer may be patterned similarly to the collector electrode on the front surface side.

As described above, the sample transfer system 1 according to one or more embodiments of the present invention is used when the solar cell substrate 101 in-process is moved; however, a system having another structure may also be used in combination. However, it is possible to use the sample transfer system 1 according to one or more embodiments of the present invention immediately before forming the transparent electrode layers 113 and 117 by a sputtering method. That is, the silicon-based thin films 111, 112, 115, and 116 are formed on the n-type single-crystalline silicon substrate 110. Judging from the experience, it is possible to use the sample transfer system 1 when the solar cell substrate 101 in-process in this state is held.

In addition, it is possible to use the sample-holding device 1 according to one or more embodiments of the present invention also when the solar cell substrate 101 in-process is moved after the transparent electrode layers 113 and 117 are formed. In particular, in the heterojunction solar cell, the silicon substrate 110 and the silicon-based thin films 111, 112, 115, and 116 are generally sensitive and likely to be damaged. When the silicon substrate 110 and silicon-based thin films 111, 112, 115, and 116 are damaged, failure may occur in a case where plating or the like is applied subsequently. Therefore, it is possible to use the sample-holding device 1 according to one or more embodiments of the present invention. In addition, since the heterojunction solar cell generally includes the transparent electrode layers 113 and 117, and each of the transparent electrode layers 113 and 117 is as thin as about 10 to 140 nm, the transparent electrode layers 113 and 117 are also likely to be damaged. Due to the above-described reason, it is recommended to use the sample-holding device 1 according to one or more embodiments of the present invention also when the solar cell substrate 101 in-process is moved after the transparent electrode layers 113 and 117 are formed.

In the above-described manufacturing method, the base electrode layer 107 is provided on the first transparent electrode layer 113, and the plating layer is formed on the base electrode layer 107; however, the plating layer may be provided directly on the first transparent electrode layer 113. In addition, in one or more embodiments of the present invention, a description has been given of a mode where the collector electrode provided on the light-receiving surface side. However, the collector electrode may not be provided on the light-receiving surface side and only the back-surface electrode layer may be provided on the light-receiving surface side.

The above-described embodiment is for manufacturing a heterojunction crystalline silicon solar cell; however, one or more embodiments of the present invention can be adopted in a case of manufacturing a solar cell other than the heterojunction crystalline silicon solar cell. That is, one or more embodiments of the present invention are especially effective in a case where a crystalline silicon substrate is used as a sample, and can be used in a case where a normal diffusion-type crystalline silicon or the like is used. In that case, since an amorphous layer is not formed by CVD, the CVD device may be provided or may not be provided (the CVD device is used in a case of a heterojunction solar cell). In addition, the transparent electrode layers 113 and 117 are not limited to those formed by the sputtering method, and can also be formed by an ion plating method. The collector electrode is not limited to one formed by printing and plating. The collector electrode can be formed by one of printing and plating, or can be formed by the sputtering method.

In the above-described embodiment, the pin circular in cross-section is used as an example of the contact member; however, the cross-sectional shape of the pin is not necessarily circular and may also be angular. In addition, the contact member may be a plate-like member. In the above-described embodiment, the main body 30 of the sample-holding device 20 is a quadrangle; however, the main body 30 may be a polygon other than the quadrangle. In addition, the main body 30 may be circular.

In the above-described embodiment, the flat countersunk head screw is adopted as the sample-supporting member; however, the sample-supporting member may not be a flat countersunk head screw. In the above-described embodiment, the process is adopted where the substrate (sample) 10 is mounted on the substrate holder (sample-mounting member) 3 in a state where the substrate holder 3 is placed in the horizontal orientation, and then, the orientation of the substrate holder 3 is changed into vertical, and after that the orientation of the substrate holder 3 is returned to horizontal. However, the process of changing the orientation of the substrate holder 3 is not essential. That is, the substrate 10 may be mounted on the substrate holder 3 in a state where the substrate holder 3 is placed in the horizontal orientation, and the substrate holder 3 may be conveyed to another device as it is.

In a case where the orientation of the substrate holder 3 is not changed during the process, the sample-supporting member 60 is not necessarily provided on the substrate holder 3. However, for example, in a case where the substrate 10 is mounted on the substrate holder 3 and the substrate holder 3 is conveyed as it is to the CVD device or the sputtering device, examples of a mechanism for conveying the substrate into the device include roller conveyance driven by a motor and conveyance performed by a robot arm. During conveyance performed by such a conveyance mechanism, there is a concern that the position or the orientation of the substrate 10 changes due to vibration in the vertical direction or an inertial force in the horizontal direction when the substrate 10 is transferred between adjacent rollers or when the motor is accelerated or decelerated. In such a case, in order to maintain the orientation and the position of the substrate 10, it is possible to provide a positioning member 65 similar to the sample-supporting member 60. In addition, the positioning member 65 may be a flat countersunk head screw having an inclination toward inside as illustrated in the above-described embodiment. That is, when a head 70 has an inverted tapered shape as in a flat countersunk head screw, the side of the substrate 10 is engaged with the head 70, and floating of the substrate 10 can be prevented. In addition, since the head 70 is flat, an abnormal discharge is less likely to occur, and a uniform plasma discharge is generated. The positioning member may be a cone-shaped member or a circular flat-shaped member. When a cone-shaped positioning member 65 is used, the substrate 10 is in the most stable orientation when the substrate 10 is in contact with the substrate holder 3.

A washer-like positioning member is assumed as an example of the circular flat-shaped positioning member. For example, it is considered that circular flat-shaped plates different in diameter are prepared, the circular flat-shaped plates are stuck together to form a stepped shape and to form a shape close to an inverted tapered shape, and the obtained member is used as the positioning member. That is, a circular flat-shaped object smaller in diameter is arranged on the substrate holder 3 and a circular flat-shaped object greater in diameter is arranged on the distant direction from the substrate holder 3 to form a stepped part.

Figure 18:
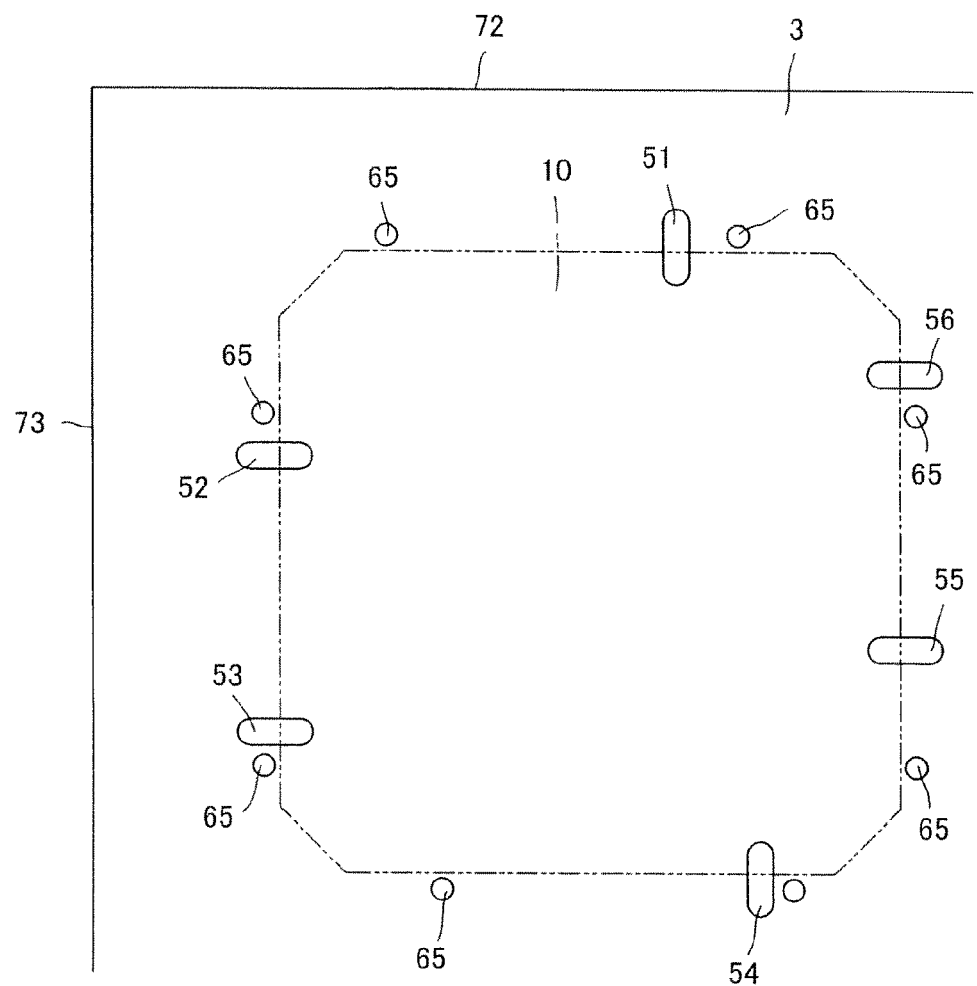
FIG. 18 is a plan view of one predetermined sample-mounting region, recessed parts corresponding to the predetermined sample-mounting region, and sample-supporting members of a substrate holder adopted in one or more embodiments of the present invention.
Figure 19:
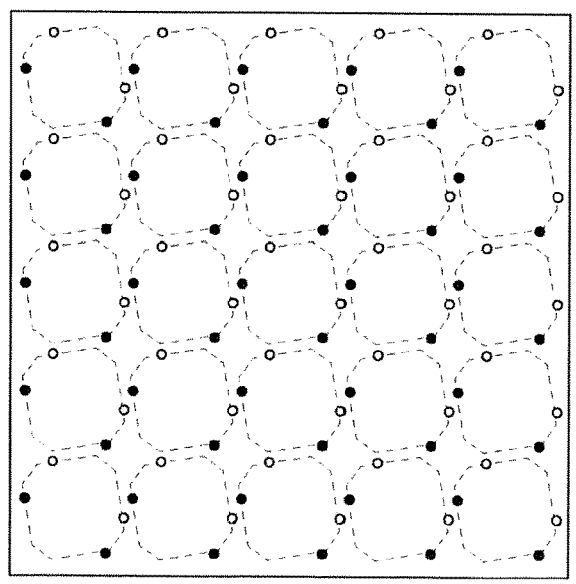
FIG. 19 is a plan view of a substrate plate disclosed in Patent Document 2.
Figure 20:
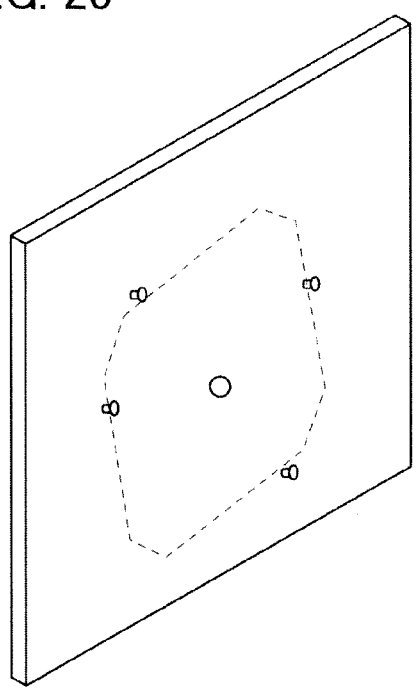
FIG. 20 is a partially cross-sectional perspective view of the substrate plate disclosed in Patent Document 2.

In a case where the orientation of the substrate holder 3 is not changed during the process, the positioning member does not need to be configured to support the lower side of the substrate 10 as illustrated in the above-described embodiment. Therefore, the positioning members 65 may be brought into contact with or in proximity to the four sides of the substrate 10 as illustrate in FIG. 18. In addition, the positions of the two sample-supporting members 61 and 62 are shifted from each other since the orientation of the substrate holder 3 is changed to vertical and it is necessary to incline the substrate 10 at that time. However, when the substrate holder 3 is moved to another device in a state where the orientation of the substrate holder 3 is maintained to be horizontal, it is not necessary to shift the positions of the positioning members 65 from each other. Note that each of the sample-supporting members 60, 61, and 63 in FIG. 5 also has the function of the positioning member 65.

In one or more embodiments of the present invention, as illustrated in FIG. 2, the contact pins 31 and 34 provided at positions facing each other in the adjacent sample-holding devices 20, the contact pins 31 and 34 belonging to the adjacent sample-holding devices 20, are in a staggered positional relation. The same applies to the substrate holder 3, and two of the recessed parts 51, 52, 53, 54, 55, and 56 provided at positions facing each other, the two of the recessed parts 51, 52, 53, 54, 55, and 56 corresponding to the adjacent predetermined sample-mounting regions 50, are in a staggered positional relation. According to this configuration, the substrate holder 3 can mount more substrates 10, and therefore this configuration is recommended. However, the present invention is not limited to this configuration and the contact pins 31 and 34 provided at positions facing each other in the adjacent sample-holding devices 20, the contact pins 31 and 34 belonging to the adjacent sample-holding devices 20, may be arranged on a straight line. The same applies to the substrate holder 3, and two of the recessed parts 51, 52, 53, 54, 55, and 56 provided at positions facing each other, the two of the recessed parts 51, 52, 53, 54, 55, and 56 corresponding to the adjacent predetermined sample-mounting regions 50, may be arranged on a straight line. Furthermore, with respect to the recessed parts, two of the recessed parts 51, 52, 53, 54, 55, 56 which are provided at positions facing each other may be connected to each other to form one long recessed part.

In addition, in the above-described embodiment, the planar shape of each of the recessed parts 51, 52, 53, 54, 55, and 56 is oval; however, the planar shape of the recessed part is arbitrary. For example, the planar shape of the recessed part may be an exact circle, a quadrangle, or the like, having the size large enough for the contact pin 31 or the like to move inside. In addition, the recessed part may be a shape annularly surrounding the predetermined sample-mounting region 50. Furthermore, the predetermined sample-mounting region 50 may be raised. As a result, the portion around the predetermined sample-mounting region 50 becomes lower than the predetermined sample-mounting region 50, and thus the recessed part is formed.

In addition, the sample-mounting member is not limited to the substrate holder 3, and may be part of another device.

Although the disclosure has been described with respect to only a limited number of embodiments, those skilled in the art, having benefit of this disclosure, will appreciate that various other embodiments may be devised without departing from the scope of the present invention. Accordingly, the scope of the present invention should be limited only by the attached claims.

EXPLANATION OF REFERENCE SIGNS

1: sample transfer system
3: substrate holder (sample-mounting member)
5: sample-moving device
10: substrate (sample)
20: sample-holding device
21: holding device group
31, 32, 33, 34, 35, 36: contact pin (contact member)
41, 42, 43, 44: movement mechanism
47: sample-holding surface
50: predetermined sample-mounting region
51, 52, 53, 54, 55, 56: recessed part
60, 61, 62: sample-supporting member
65: positioning member

What is claimed is:

1. A sample transfer system comprising:
a sample-mounting member mounting a sample thereonto; and
a sample-moving device lifting the sample to move the sample between the sample-mounting member and another location,
wherein the sample-mounting member comprises a first predetermined sample-mounting region mounting the sample,
wherein the first predetermined sample-mounting region comprises two or more first recessed parts on or around a side of the first predetermined sample-mounting region,
wherein the sample-moving device comprises a first sample-holding device, the first sample-holding device comprising:
a sample-holding surface facing the sample to be lifted;
two or more first contact members each contacting with the sample, wherein each of the first contact members comprises a portion suspended in a Z direction vertical to the sample-holding surface; and
one or more movement mechanisms moving the two or more first contact members, wherein each movement mechanism holds one or more of the first contact members and includes a drive actuator that drives the movement mechanism,
wherein the first sample-holding device generates negative pressure by making a gas flow between the sample-holding surface and the sample to suck the sample toward the sample-holding surface by the negative pressure, and holds the sample at a position in proximity to the sample-holding surface,
wherein the suspended portion of each of the first contact members enters each of the first recessed parts when the first sample-holding device is brought in proximity to the first predetermined sample-mounting region, the suspended portion of the first contact member moving within the first recessed part by operating the drive actuator to correct an orientation of the sample on the sample-mounting member,
wherein the first contact member is a pin and the first recessed part is a slot, and
wherein one or more of the first contact members move in an X direction to approach or leave the sample holding surface and one or more of the first contact members move in a Y direction to approach or leave the sample holding surface, the X and Y directions being perpendicular to each other and parallel to the sample holding surface.

2. The sample transfer system according to claim 1,
wherein the sample-holding surface is a polygon, and
wherein the two or more first contact members are provided at peripheries of two different sides of the sample-holding surface.

3. The sample transfer system according to claim 1,
wherein the sample-moving device further comprises a second sample-holding device comprising one or more second contact members and located adjacently to the first sample holding-device,
wherein each of the second contact members comprises a portion suspended in the Z direction vertical to the sample-holding surface, and
wherein each of the first contact members and each of the second contact members are in a staggered positional relation.

4. The sample transfer system according to claim 3,
wherein the first and second sample-holding devices are linearly arranged and connected in series in the X direction parallel to the sample-holding surface.

5. The sample transfer system according to claim 4,
wherein the sample-moving device further comprises a traveling rail extending in the Y direction and a guide that moves on the traveling rail, and wherein the guide lifts and lowers the first and second sample-holding devices in the Z direction and moves with the first and second sample-holding devices in the Y direction.

6. The sample transfer system according to claim 1, wherein the sample-mounting member is a plate, and
wherein one or more sample-supporting members are provided on or around a side of the first predetermined sample-mounting region, the sample contacting with the sample-supporting member to prevent the sample from falling when the sample-mounting member is in the vertical orientation.

7. The sample transfer system according to claim 1, wherein the sample is a semiconductor substrate or a solar cell in-process including a semiconductor layer partly.

8. The sample transfer system according to claim 1, wherein the sample is a crystalline silicon substrate or a solar cell in-process including a crystalline silicon substrate.

9. The sample transfer system according to claim 1, wherein the sample-mounting member includes a positioning member that prevents the sample from changing its position or orientation.

10. A method for manufacturing a semiconductor substrate or a solar cell that includes a semiconductor substrate partly, the method comprising:
holding the sample by the first sample-holding device of the sample transfer system according to claim 1,
wherein the sample is a solar cell substrate in-process.

11. The method according to claim 10, wherein the solar cell substrate in-process is a crystalline silicon substrate or a solar cell substrate in-process including a crystalline silicon substrate.

12. The method according to claim 10, the method further comprising lifting the sample mounted on the sample-mounting member using the first sample-holding device,
wherein during the lifting, orientation of the substrate is corrected by bringing the first sample-holding device of the sample-moving device close to the substrate and by operating the movement mechanism.

13. The method according to claim 10, the method further comprising forming a transparent conductive film on the substrate after the holding.

14. The sample transfer system according to claim 1,
wherein the sample-mounting member further comprises a second predetermined sample-mounting region comprising one or more second recessed parts and located adjacently to the first predetermined sample-mounting region, and
wherein each of the first recessed parts and each of the second recessed parts are in a staggered positional relation.

15. A sample transfer system comprising:
a sample-mounting member mounting a plurality of samples thereonto; and
a sample-moving device lifting the samples to move the samples between the sample-mounting member and another location,
wherein the sample-mounting member comprises: a plurality of predetermined sample-mounting regions mounting the samples,
wherein each of the sample-mounting regions comprises one or more recessed parts on or around a side of the predetermined sample-mounting region,
wherein the sample-moving device comprises a plurality of sample-holding devices, each sample-holding device comprising:
a sample-holding surface facing the sample to be lifted;
one or more contact members each contacting with the sample, wherein each of the contact members comprises a portion suspended in a Z direction vertical to the sample-holding surface; and
one or more movement mechanisms moving the contact member in an X direction or a Y direction along the sample-holding surface, wherein each movement mechanism holds the one or more contact members, and wherein the X and Y directions are perpendicular to each other and parallel to the sample holding surface,
wherein the sample-moving device further comprises a traveling rail extending in the Y direction and a guide that moves on the traveling rail, and
wherein the guide lifts and lowers the plurality of the sample-holding devices in the Z direction and moves with the plurality of the sample-holding devices in the Y direction,
wherein the plurality of the sample-holding devices are linearly arranged and connected in series in the X direction parallel to the sample-holding surface,
wherein each of the sample-holding devices generates negative pressure by making a gas flow between the sample-holding surface and the sample to suck the sample toward the sample-holding surface by the negative pressure, and holds the sample at a position in proximity to the sample-holding surface,
wherein the suspended portion of each of the contact members enters each of the recessed parts when the sample-holding device is brought in proximity to the predetermined sample-mounting region, the suspended portion of the contact member moving within the recessed part by operating the movement mechanism to correct an orientation of the sample on the sample-mounting member, and
wherein the contact member is a pin and the recessed part is a slot.

16. The sample transfer system according to claim 15,
wherein the one or more contact members of adjacent sample holding-devices are in a staggered positional relation.

17. The sample transfer system according to claim 15,
wherein the one or more recessed parts of adjacent sample-mounting regions are in a staggered positional relation.

18. The sample transfer system according to claim 15,
wherein each of the sample-mounting regions comprises a plurality of the recessed parts,
wherein each of the sample-holding devices comprises a plurality of the contact members,
wherein the sample-holding surface is a polygon, and
wherein the plurality of contact members are provided at peripheries of two different sides of the sample-holding surface.

19. The sample transfer system according to claim 15,
wherein the sample-mounting member is a plate, and
wherein one or more sample-supporting members are provided on or around a side of the predetermined sample-mounting region, the sample contacting with the sample-supporting member to prevent the sample from falling when the sample-mounting member is in the vertical orientation.

* * * * *